United States Patent
Hikita et al.

[11] Patent Number: 6,133,637
[45] Date of Patent: Oct. 17, 2000

[54] SEMICONDUCTOR DEVICE HAVING A PLURALITY OF SEMICONDUCTOR CHIPS

[75] Inventors: Junichi Hikita; Kazutaka Shibata; Tsunemori Yamaguchi; Tadahiro Morifuji; Osamu Miyata, all of Kyoto, Japan

[73] Assignee: Rohm Co., Ltd., Kyoto, Japan

[21] Appl. No.: 09/155,134

[22] PCT Filed: Jan. 22, 1998

[86] PCT No.: PCT/JP98/00281

§ 371 Date: Sep. 18, 1998

§ 102(e) Date: Sep. 18, 1998

[87] PCT Pub. No.: WO98/33217

PCT Pub. Date: Jul. 30, 1998

[30] Foreign Application Priority Data

| Jan. 24, 1997 | [JP] | Japan | 9-011639 |
| Feb. 3, 1997 | [JP] | Japan | 9-020217 |
| Feb. 27, 1997 | [JP] | Japan | 9-043683 |
| Mar. 12, 1997 | [JP] | Japan | 9-057368 |
| Mar. 13, 1997 | [JP] | Japan | 9-058906 |
| Mar. 21, 1997 | [JP] | Japan | 9-068539 |
| Jun. 3, 1997 | [JP] | Japan | 9-145095 |
| Jun. 17, 1997 | [JP] | Japan | 9-159912 |
| Jul. 22, 1997 | [JP] | Japan | 9-195560 |
| Dec. 2, 1997 | [JP] | Japan | 9-331597 |
| Dec. 2, 1997 | [JP] | Japan | 9-331598 |
| Dec. 2, 1997 | [JP] | Japan | 9-331599 |
| Dec. 2, 1997 | [JP] | Japan | 9-331601 |

[51] Int. Cl.⁷ ............................................. H01L 29/40
[52] U.S. Cl. .................. 257/777; 257/779; 257/778; 257/784; 257/686; 257/795; 257/666; 438/108; 438/109
[58] Field of Search .................................. 257/685, 686, 257/777, 778, 737, 779, 784, 795, 666; 438/108, 109

[56] References Cited

U.S. PATENT DOCUMENTS

| 4,620,215 | 10/1986 | Lee | 357/81 |
| 4,764,804 | 8/1988 | Sahara et al. | 357/81 |
| 5,108,950 | 4/1992 | Wakabayashi et al. | 437/183 |
| 5,148,266 | 9/1992 | Khandros et al. | 357/80 |
| 5,376,825 | 12/1994 | Tukamoto et al. | 257/685 |
| 5,523,628 | 6/1996 | Williams et al. | 257/777 |
| 5,864,178 | 1/1999 | Yamada et al. | 257/737 |

FOREIGN PATENT DOCUMENTS

0782191  2/1997  European Pat. Off. .

*Primary Examiner*—Tom Thomas
*Assistant Examiner*—Luan Thai
*Attorney, Agent, or Firm*—Hoffmann & Baron, LLP

[57] ABSTRACT

A semiconductor device includes first and second semiconductor chips. The first semiconductor chip is formed with a plurality of first electrodes on a surface thereof, while the second semiconductor chip is formed with a plurality of second electrodes on a surface thereof. These surfaces are positioned facing to each other, thereby connecting between the first electrode and the second electrode. The respective surfaces are formed with circuit elements. The circuit elements are covered by the first semiconductor chip and the second semiconductor chip The first semiconductor chip and the second semiconductor chip at their connecting portions are encapsulated by a synthetic resin that is excellent in moisture resistance. The first semiconductor chip and the second semiconductor chip are entirely packaged by a second synthetic resin that is excellent in adhesibility.

24 Claims, 35 Drawing Sheets

SEMICONDUCTOR DEVICE HAVING A PLURALITY OF SEMICONDUCTOR CHIPS

TECHNICAL FIELD

This invention relates to a semiconductor device and method for manufacturing same. More specifically, this invention relates to a semiconductor device having a plurality of semiconductor chips mounted on one another, and a method for manufacturing such a semiconductor device.

PRIOR ART

There is a conventional semiconductor device of this kind disclosed as one example in Japanese Patent Laying-Open No. H6-112402 laid open on Apr. 22, 1994. This prior art includes two IC chips connected at their surfaces through bumps and transfer-molded by a resin. In this prior art, however, resin tends to intrude into a gap between the IC chips during transfer molding, resulting in a possibility of damaging to the IC chips.

Meanwhile, there is also a technique disclosed in Japanese Patent Laying-Open No. H6-209071 laid open on Jul. 26, 1994 wherein, prior to transfer molding, a resin is filled in a gap between two IC chips. This eliminates the above-stated problem of damaging to the IC chips.

However, positive electrical connection between the IC chip is not available by any of the prior arts.

Further, there is a necessity of accurately recognizing the positions of electrodes when mounting one IC chip on the other IC chip. It is a conventional practice to image electrodes of an IC chip on a chip-by-chip basis. That is, two cameras must be used to image the electrodes of these IC chips, thus raising a problem of mounting up of cost.

SUMMARY OF THE INVENTION

Therefore, it is a primary object of this invention to provide a semiconductor device having two IC chips that are positively in electrical connection with their surfaces placed faced to each other.

It is another object of this invention to provide a method for manufacturing a semiconductor device by which manufacturing cost can be kept low.

A semiconductor device according to the present invention comprises: a first semiconductor chip having a first surface formed with a first electrode; a second semiconductor chip having a second surface formed with a second electrode to be connected to the first electrode and facing to the first surface; a bump formed on at least one of the first electrode and the second electrode; and an anisotropic conductive member interposed between the first surface and the second surface.

According to this invention, the first semiconductor chip and the second semiconductor chip are placed with their surfaces faced to each other. The bump is formed on the first electrode or second electrode, and an anisotropic conductive member is interposed between the first semiconductor chip and the second semiconductor chip. The anisotropic conductive member exhibits electrical conductivity in a thickness direction at a portion exerted by pressure. Consequently, the depression of the bump against the anisotropic conductive member provides electrical connection only between the first electrode and the second electrode, with other portions kept in insulation. Due to this, the first semiconductor chip and the second semiconductor chip are brought into electrical connection therebetween.

In one aspect of this invention, the first semiconductor chip and the second semiconductor chip at their joining portion are packaged by a first synthetic resin excellent in moisture resistance. The first semiconductor chip, the second semiconductor chip, and the first synthetic resin are packaged by a second synthetic resin that is excellent in adhesibility. Due to this, it is possible to protect the circuit elements that are less resistive to moisture, and improve the durability for the semiconductor chips.

In another aspect of this invention, the first electrode is formed with a bump while the second electrode with a recess. The recess serves to prevent the conductive particles from escaping sideways when the anisotropic conductive member is depressed by the bump. Due to this, the first semiconductor chip and the second semiconductor chip can be electrically connected therebetween more positively without increasing an amount of the conductive particles.

A method for manufacturing a semiconductor chip according to the present invention, comprising steps of: (a) placing a first semiconductor chip formed on a first surface with a first electrode, with the first surface directed upward; (b) imaging the first surface from above to determine a position of the first electrode; (c) position a second semiconductor chip formed on a second surface with a second electrode, with the second surface directed downward; (d) imaging one of the first surface and a back surface of the second semiconductor chip to determine a position of the second electrode; and (e) mounting the second semiconductor chip on the first semiconductor chip such that the first electrode and the second electrode are connected with each other.

According to this invention, the first semiconductor upwardly directed is imaged at its surface, and then the second semiconductor chip placed face down on the first semiconductor chip is imaged. Due to this, recognition is made for both the first electrode formed on the first semiconductor chip as well as the second electrode on the second semiconductor chip, and then the first and second electrodes are connected with each other. That is, the first semiconductor chip and the second semiconductor chip can be imaged by one camera, thus reducing manufacturing cost.

In one aspect of this invention, the second semiconductor chip is imaged at its back surface, and the position of the second electrode is determined from a result of the imaging.

In a preferred embodiment of this invention, a mark formed on the back surface of the second semiconductor chip is recognized, and the position of the second electrode is determined based on this mark. Due to this, the second semiconductor chip can be mounted on the first semiconductor chip without shifting a direction of the camera.

In another aspect of the present invention, the surface of the second semiconductor chip is imaged through a mirror, and the position of the second electrode is determined based on a result of the imaging. Therefore, the second electrode can be determined in position with accuracy.

The above described objects and other objects, features, aspects and advantages of the present invention will become more apparent from the following detailed description of the present invention when taken in conjunction with the accompanying drawings.

BEST FORM FOR PRACTICING THE INVENTION

Figure 1:
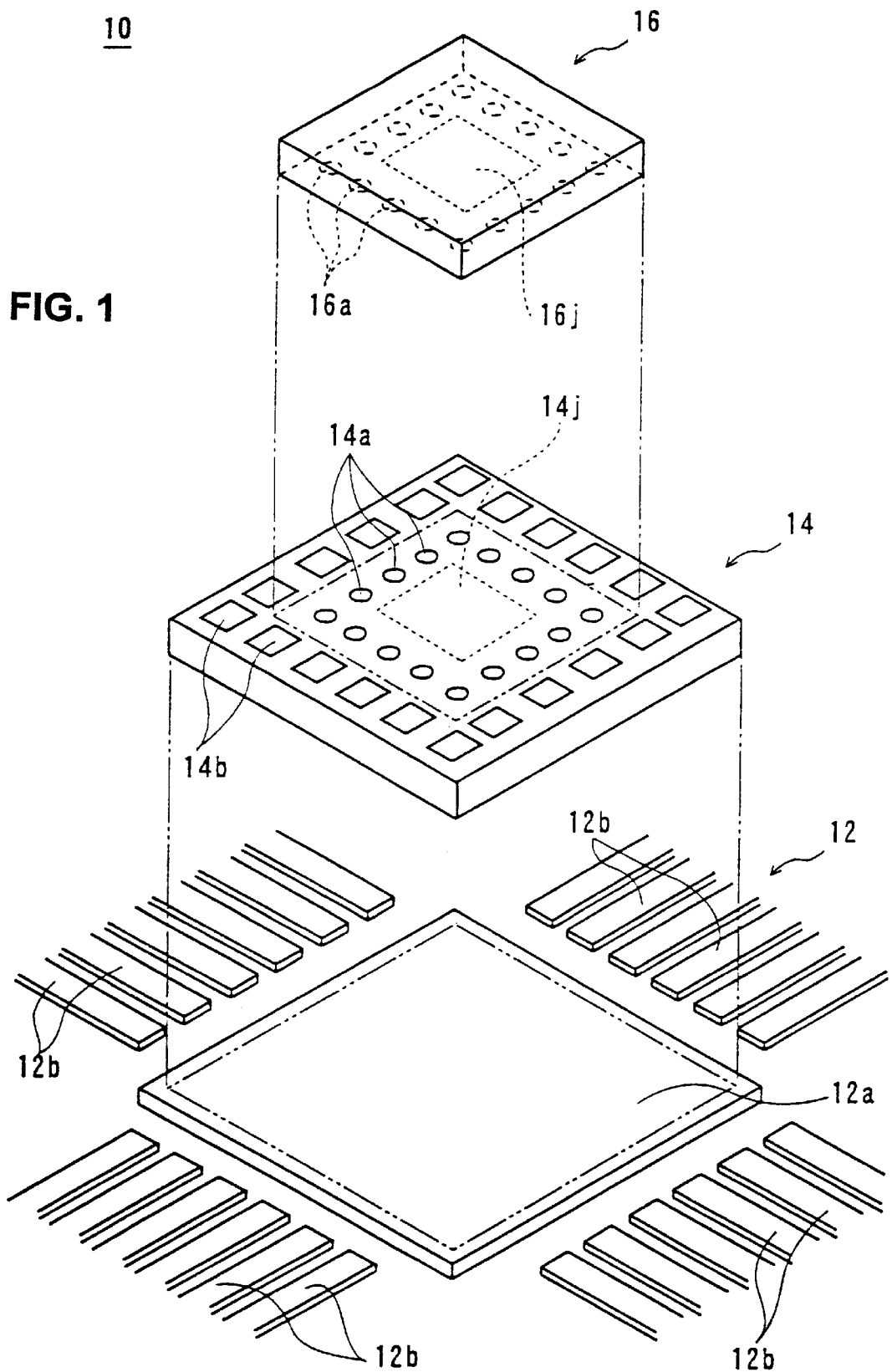
FIG. 1 is an illustrative view showing one embodiment of this invention.

A semiconductor device 10 in an embodiment shown in FIG. 1 includes a leadframe 12. The leadframe 12 has at its center a base plate 12a in a rectangular form. This base plate 12a has a plurality of lead terminals 12b outwardly extending from four sides thereof. The base plate 12a has an IC main chip 14 mounted on a surface thereof. This IC main chip 14 is formed at a surface center with a plurality of circuit elements (first circuit elements) 14j such as active or passive elements. A plurality of electrode pads (first electrodes) 14a for connection to the IC sub-chip 16 are formed around the circuit elements 14j. Further, a plurality of electrode pads (third electrodes) 14b to be wire-bonded to the lead terminals 12b are formed around the electrode pads 14a. The IC main chip 14 is mounted with the IC sub-chip 16 with their surfaces faced to each other. This IC sub-chip 16 also has a plurality of circuit elements (second circuit elements) 16j such as active or passive elements, similarly to the IC main chip 14. A plurality of electrode pads (second electrodes) 16a are formed around the circuit elements 16j, for connection to the electrode pads 14a provided on the IC main chip 14.

Figure 2:
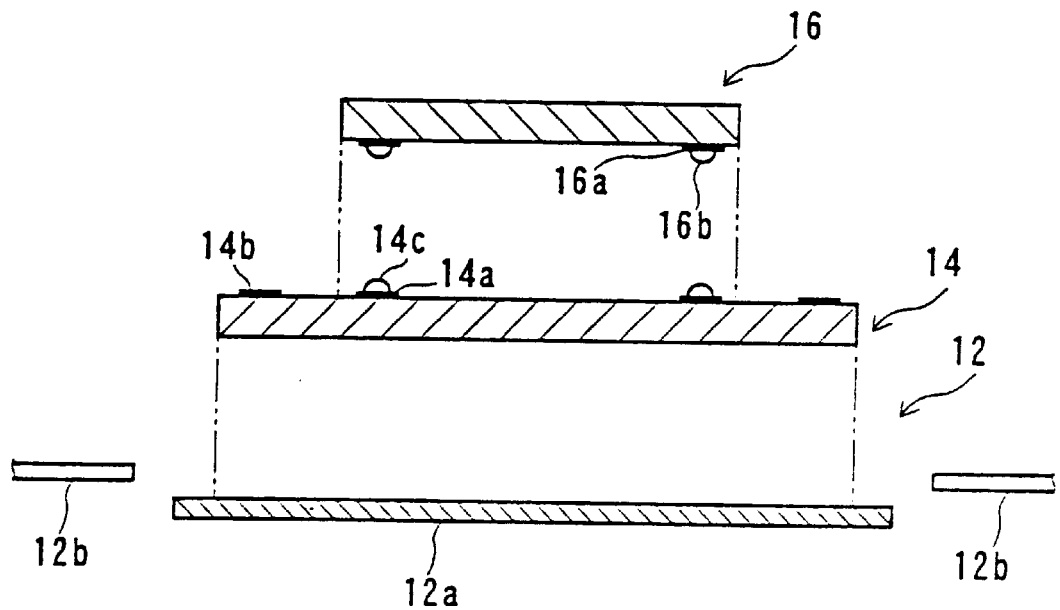
FIG. 2 is an illustrative view showing one part of a structure of the FIG. 1 embodiment.
Figure 3:
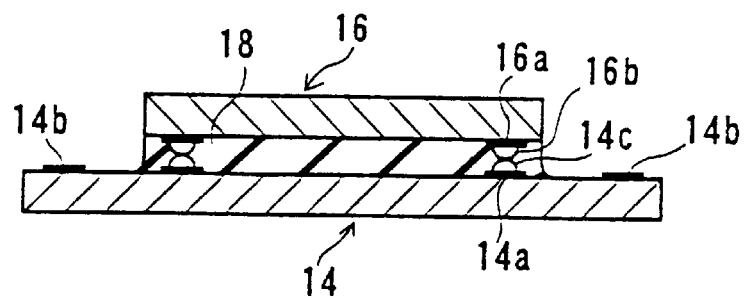
FIG. 3 is an illustrative view showing another part of the structure of the FIG. 1 embodiment.

As shown in FIG. 2, the electrode pads 14a on the IC main chip 14 and the electrode pads 16a on the IC sub-chip 16 respectively have bumps 14c and 16b formed of gold or solder. The IC sub-chip 16 is placed face down, i.e., with the surface having the circuit elements 16j and the electrode pads 16a faced downward, as shown in FIG. 3. The IC sub-chip 16 is mounted on the IC main chip 14 such that the bumps 16b on the IC sub-chip 16 are respectively abutted against the bumps 14c on the IC main chip 14. The IC sub-chip 16 is fixed onto the IC main chip 14 by heating entirely and pressing the IC sub-chip 16 on the IC main chip 14. Incidentally ultrasonic vibration may be applied to between the chips simultaneously with the depression. The bumps 14c and 16b have pressing forces concentrated during heating, providing positive electrical connection between the bumps 14c and 16b.

Figure 4:
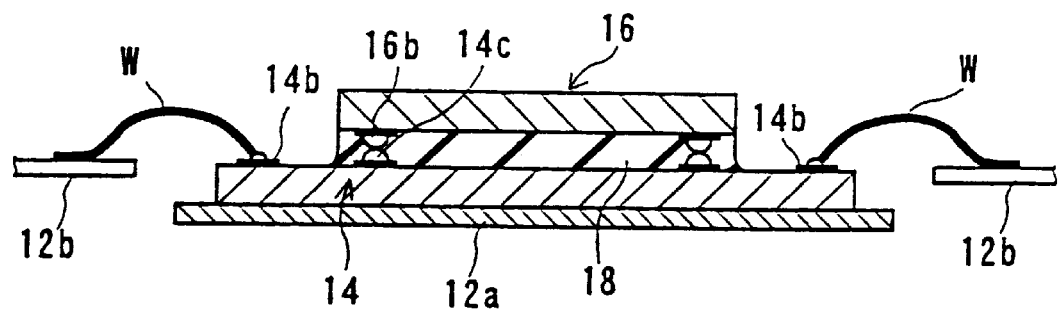
FIG. 4 is an illustrative view showing further part of the structure of the FIG. 1 embodiment.

Then, a synthetic-resin adhesive 18 such as an epoxy resin, or elastomer is filled to between the IC main chip 14 and the IC sub-chip 16. Thereafter, the IC main chip 14 at its back surface is fixed onto the base plate 12a through an adhesive, as shown in FIG. 4.

Further, wire bonding is made between the electrode pads 14b of the IC main chip 14 and the lead terminals 12b of the leadframe 12 through the use of thin gold wires W, providing electrical connection therebetween.

Figure 5:
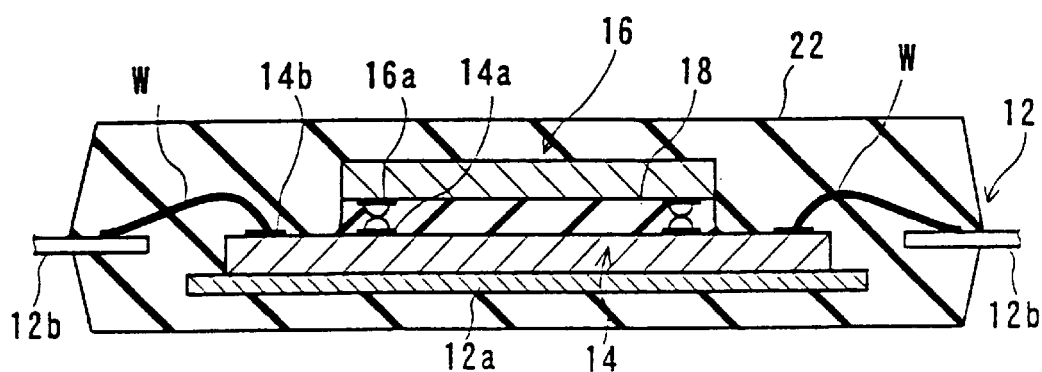
FIG. 5 is an illustrative view showing still another part of the structure of the FIG. 1 embodiment.
Figure 6:
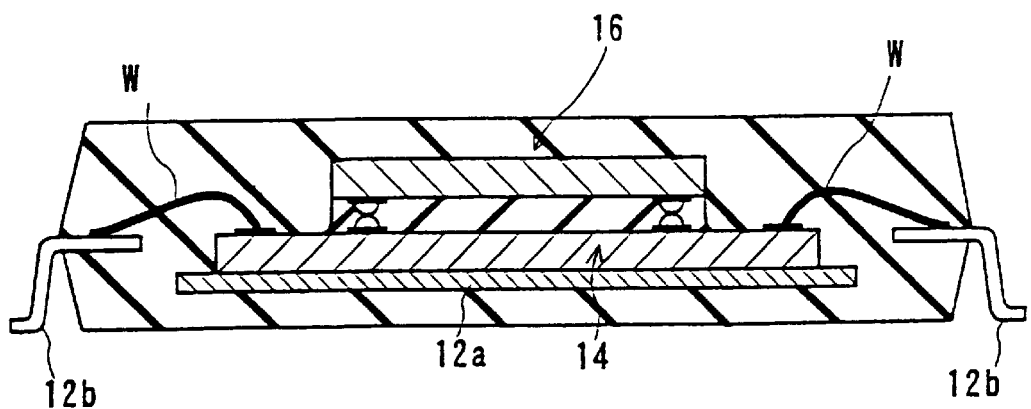
FIG. 6 is an illustrative view showing another part of the structure of the FIG. 1 embodiment.

Then, the chip assembly is entirely transfer-molded by a synthetic resin package 22, as shown in FIG. 5. The lead terminals 12b are cut out of the leadframe 12 and bent flush in plane with a back surface of the package 22 as shown in FIG. 6, thus completing a semiconductor device 10.

According to this embodiment, the semiconductor device 10 is greatly reduced in occupying area when mounted on a printed board or the like, despite the semiconductor device 10 is increased in height by a thickness of the IC sub-chip 16 mounted on the IC main chip 14. This can reduce the size of a printed board, etc. and ultimately an electrical appliance using such a semiconductor device.

Further, the circuit elements 14j on the IC main chip 14 and the circuit elements 16j on the IC sub-chip 16 are faced to each other in a manner covered by the respective IC main chip 14 and sub-chip 16. Thus, the circuit elements 14j and 16j are placed in positive protection.

Further, the filling of the synthetic resin between the IC main chip 14 and the IC sub-chip 16 can firmly integrate the IC main chip 14 and the IC sub-chip 16 in one body and protect the circuit elements 14j and 16j through the synthetic resin.

Figure 7:
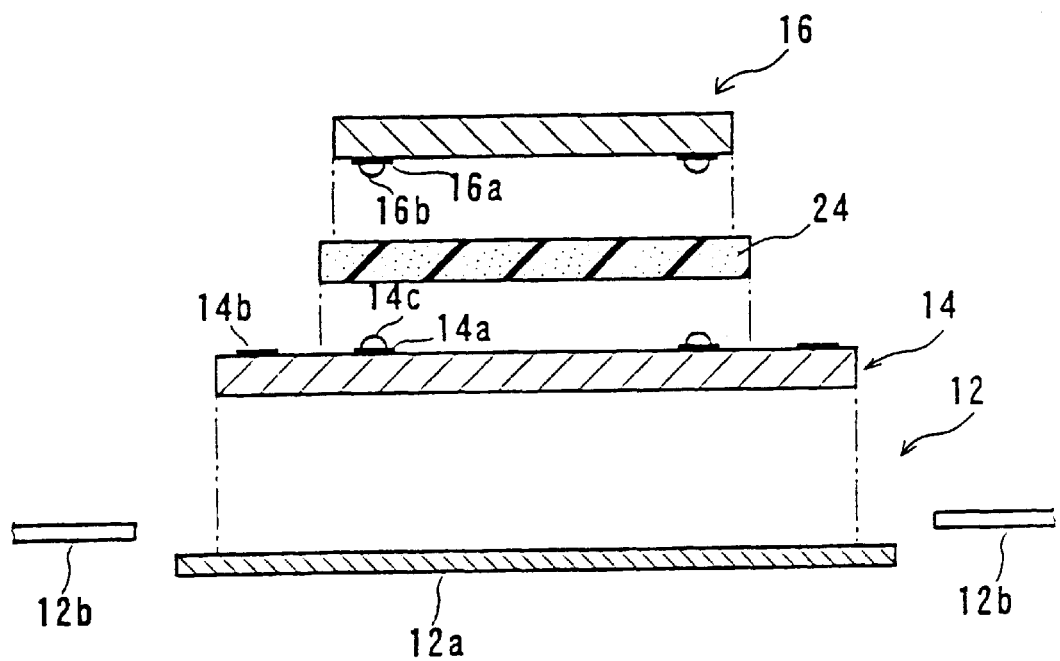
FIG. 7 is an illustrative view showing one part of a structure according to another embodiment of this invention.
Figure 8:
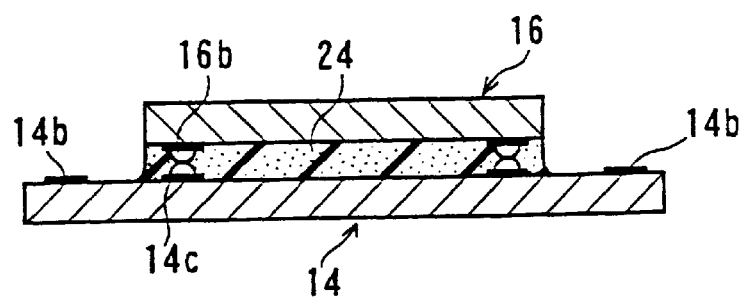
FIG. 8 is an illustrative view showing another part of the structure of the FIG. 7 embodiment.

Referring to FIG. 7 and FIG. 8, there is illustrated another embodiment structured similarly to the embodiment of FIG. 1 to FIG. 6 except for using an anisotropic conductive film 24 to mount the IC sub-chip 16 on the IC main chip 14, omitting duplicating explanations.

The anisotropic conductive film 24 is interposed between the IC main chip 14 and the IC sub-chip 16 so that the IC sub-chip 16 is depressed against the IC main chip 14 in a manner compressing and deforming the anisotropic conductive film 24. The IC sub-chip 16 is mounted on the IC main chip 14 by curing and setting the conductive film 24 by applying heating or the like while keeping the depressing state as it is. The depressing force of the IC sub-chip 16 against the IC main chip 14 causes both the bumps 14c and 16b to be forced in the conductive film 24. Due to this, the conductive particles mixed in the conductive film 24 are sandwiched between the respective bumps 14c and 16b so that these bumps 14c and 16b are put into electrical connection through the conductive particles.

According to this embodiment, the IC sub-chip 16 and the IC main chip 14 are completed of their simultaneous electrical connection and mounting only by interposing a conductive film 24 between the IC sub-chip 16 and the IC main chip 14 and applying heat thereto. This structure can reduce manufacturing cost as compared to the embodiment of FIG. 1 to FIG. 6.

Incidentally, this invention is not limited to the case that one IC sub-chip 16 is mounted on an IC main chip 14, but also applicable to a case that a plurality of IC sub-chips 16 are mounted on the IC main chip 14.

Figure 9:
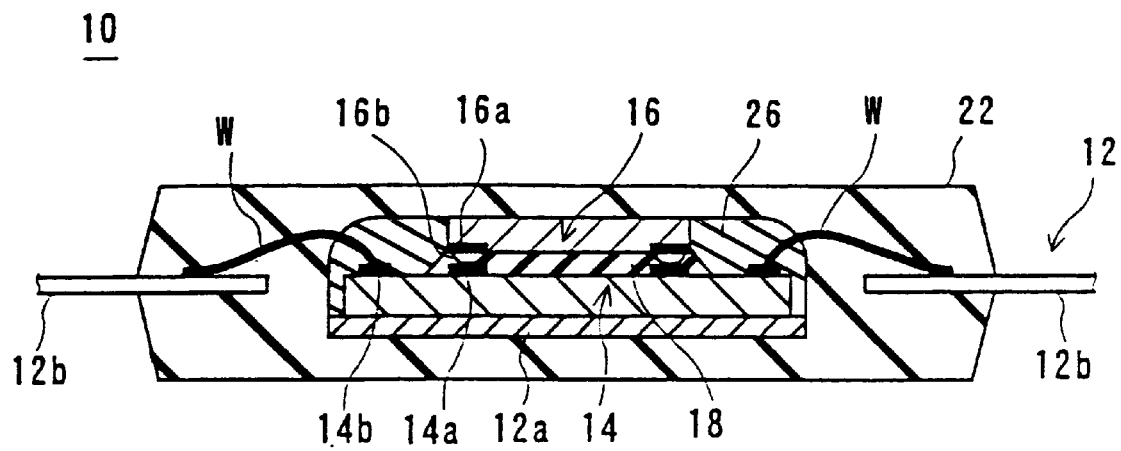
FIG. 9 is an illustrative view showing one part of a structure according to another embodiment of this invention.
Figure 10:
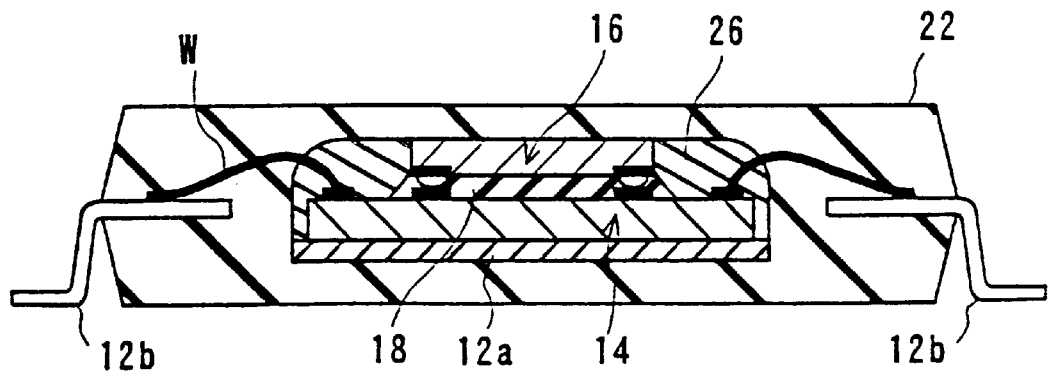
FIG. 10 is an illustrative view showing another part of the structure of the other embodiment of this invention.

A semiconductor device 10 according to another embodiment, as shown in FIG. 9, is structured similarly to the embodiment of FIG. 1 to FIG. 6 except that an inner package 26 is formed around the IC main chip 14 and the IC sub-chip 16 so that an outer package 22 is formed around the inner package 26, omitting duplicated explanations.

An inner package 26 is formed of a synthetic resin such as an epoxy resin mixed with a filler to increase its moisture resistance. That is, the inner package 26 is formed by applying such a synthetic resin in a liquid state and curing and setting the resin. Thereafter, a synthetic-resin outer package 22 is transfer-molded to provide entire encapsulation. The synthetic resin for the outer package 22 is of an epoxy resin mixed with a filler to enhance the adhesibility to the both IC chips 14, 16 and the leadframe 12.

Then, the lead terminals 12b are cut from the leadframe 12, and the lead terminals 12b are bent flush in plane with the backside of the package 22, into a complete assembly.

In this manner, different synthetic resins are used respectively for the outer package 22 encapsulating over the entire portion and the inner package 26 encapsulating only the connecting portion between the IC chips 14, 16. That is, a synthetic resin excellent in adhesibility to the IC chips 14, 16 is used for the outer package 22, while a synthetic resin excellent in moisture resistance for circuit elements is used for the inner package 26. This improves endurance and reliability for the semiconductor device 10. That is, the circuit elements 14j and 16j are prevented against moisture while the IC main chip 14 and the IC sub-chip 16 are protected against external force.

Incidentally, although this embodiment was explained on the semiconductor device using an adhesive 18 for adhering between the IC chips 14, 16, the inner package 26 may be formed over the IC chips 14, 16 adhered through an anisotropic conductive film. Also, in this embodiment the bumps were formed on the electrode pads 16a of the IC sub-chip 16. However, the bumps may be provided only on the electrode pads 14a of the IC main chip 14, or on both the electrode pads 14a and 16b.

Figure 11:
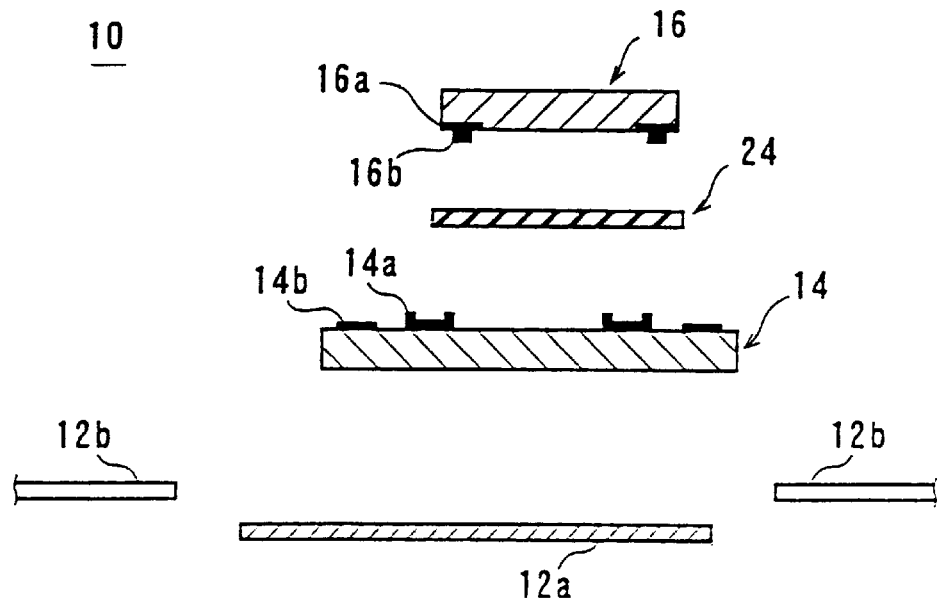
FIG. 11 is an illustrative view showing one part of a structure according to still another embodiment of this invention.

Referring to FIG. 11, a semiconductor device 10 according to still another embodiment is structured similarly to the embodiment of FIG. 7 to FIG. 8 except that the electrode pads 14a on the IC main chip 14 are in a recess form, omitting duplicated explanations.

Figure 12:
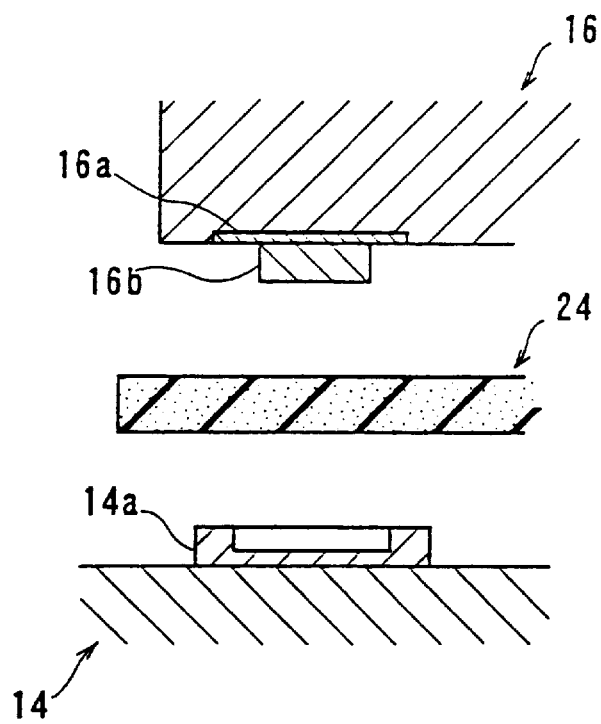
FIG. 12 is a magnification view showing one part of the FIG. 11 embodiment.
Figure 13:
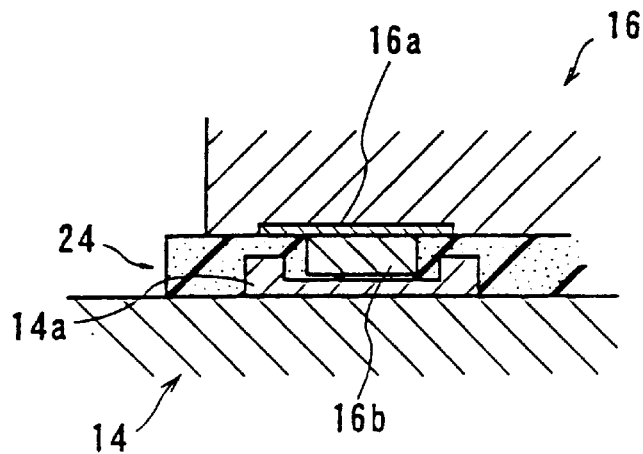
FIG. 13 is another magnification view showing the one part of the FIG. 11 embodiment.

As shown in FIG. 12 and FIG. 13, the bump 16b is received in the electrode pad 14a, so that an anisotropic conductive film 24 is compressed and deformed by the bump 16b. At this time, the conductive particles mixed in the conductive film 24 are prevented from escaping sideways between the bump 16b and the electrode pad 14a by the recess formed in the electrode pad 14a. In other words, much more conductive particles are kept in the recess of the electrode pad 14a. This improves the reliability in electrical connection without increasing the mixing amount of the conductive particles in the conductive film 24.

This is because, if the mixing amount of conductive particles is increased to improve the reliability of electrical connection between the bump 16b and the electrode pad 14a, the IC chips 14 and 16 tend to be electrically connected therebetween at portions other than the bump 16b and the electrode pad 14a. On the other hand, if the mixing amount of conductive particles are decreased to improve the electrical insulation at such portions, the amount of conductive particles sandwiched between the bump 16b and the electrode pad 14a is decreased resulting in poor electrical connection.

Contrary to this, this embodiment can prevent the conductive particles from escaping from between the bump 16b and the electrode pad 14a by the formation of the recess on the electrode pad 14a. Moreover, since the bump 16b is configured for being received in the recess, the conductive particles are positively trapped in the recess regardless of the size of the conductive particles. This improves reliability in electrical connection.

Incidentally, although in this embodiment the bump 16b is provided on the IC sub-chip 16 and the electrode pad 14a is formed in a recess form on the IC main chip 14, it is of course possible to provide a bump on the IC main chip 14 and a recess at the electrode pad 16a on the IC sub-chip 16.

Figure 14:
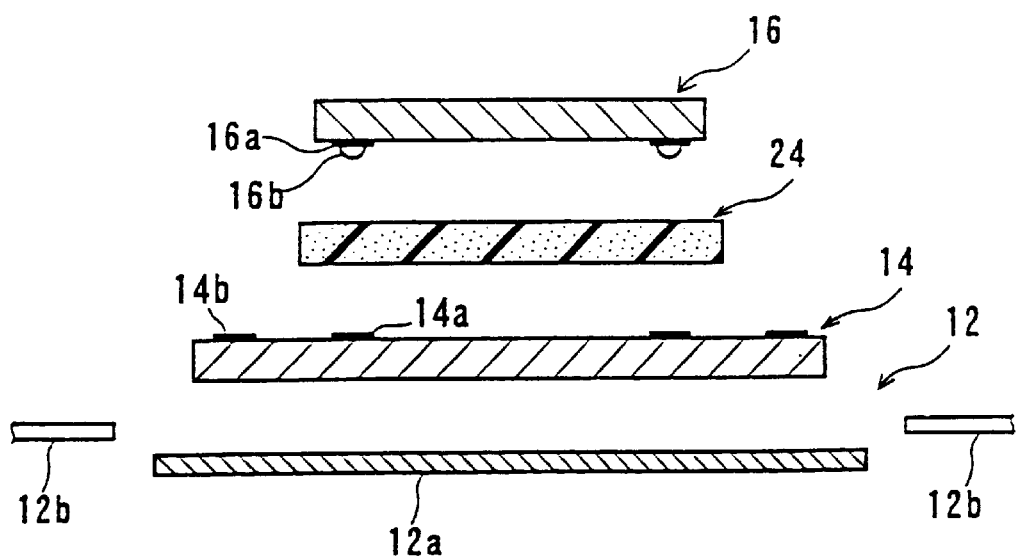
FIG. 14 is an illustrative view showing one part of a structure according to another embodiment of this invention.
Figure 15:
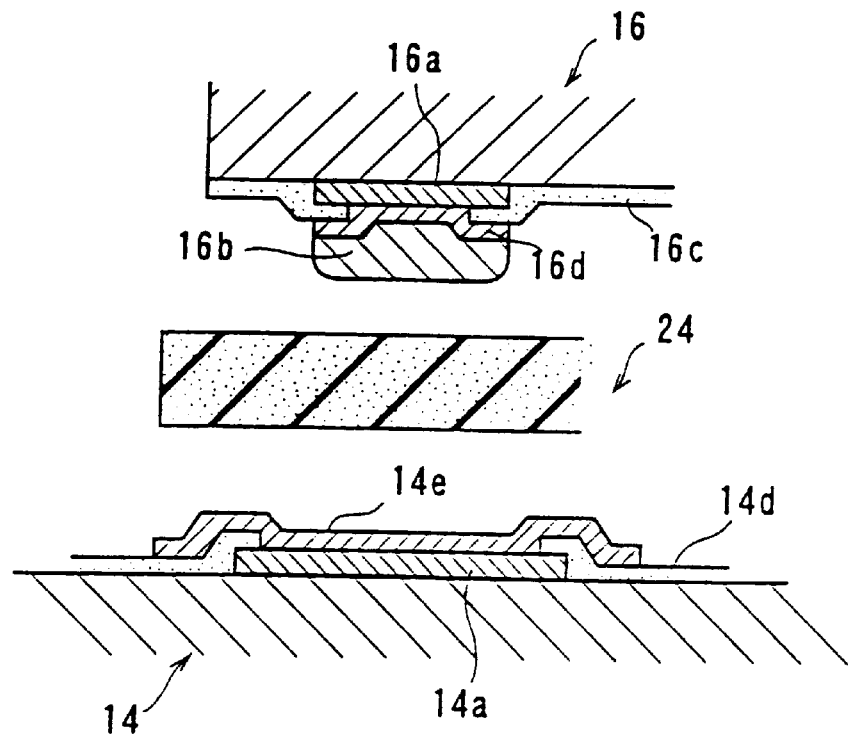
FIG. 15 is a magnification view showing one part of the FIG. 14 embodiment.

Referring to FIG. 14 and FIG. 15, a semiconductor device 10 according to another embodiment is structured similarly to the embodiment of FIG. 7 and FIG. 8 except that the IC sub-chip 16 only has a bump 16b, the IC main chip 14 and the IC sub-chip 16 are respectively formed at surfaces, with passivation films 14d and 16c, a barrier metal 14e is formed over the surface of the electrode pad 14a, and a barrier metal 16d is interposed between an electrode pad 16a and a bump 16b, omitting duplicated explanations.

The IC main chip 14 and the IC sub-chip 16 are respectively formed at their surfaces with the passivation films 14d and 16c, as shown in FIG. 15. This covers over the circuit elements. However, the electrode pads 14a and 16a are respectively partially covered by the passivation films 14d and 16c. Instead, the barrier metals 14e and 16d completely cover the respective electrode pads 14a and 16a. That is, the passivation films 14d and 16c respectively cover edges of the electrode pads 14a and 16a, and the barrier metals 14e and 16d cover the electrode pads 14a, 16a and passivation films 14d, 16c. A bump 16b is formed on a surface of the barrier metal 16d. Incidentally, the barrier metals 14e and 16d are in a two-layered structure having, for example, a titanium lower layer and a tungsten upper layer or otherwise a chromium lower layer with a silver upper layer.

Figure 16:
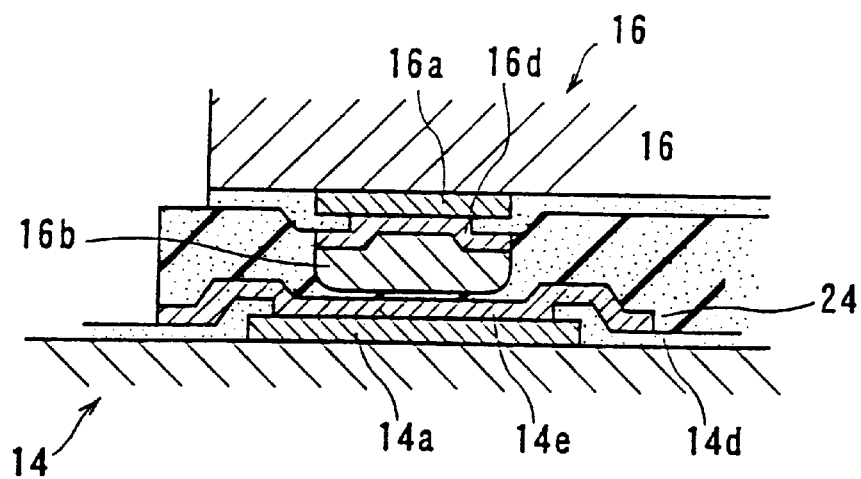
FIG. 16 is another magnification view showing the one part of the FIG. 15 embodiment.

As shown in FIG. 16, the electrode pads 14a and 16a are electrically connected by compressing and deforming an anisotropic conductive film 24 through the bump 16b. The formation of barrier metals 14e and 16d respectively on the surfaces of the electrode pads 14a and 16a positively relieves the electrode pads 14a and 16a of damages due to the bump 16b during film compression and deformation.

As will be understood from FIG. 15 and FIG. 16, the barrier metal 14e is formed at its surface center with a recess for receiving the bump 16b. Due to this, this recess prevents the conductive particles between the bump 16b and the barrier metal 14e from escaping sideways when the conductive film 24 is compressed and deformed by the bump 16b. That is, this improves the reliability in electrical connection.

Figure 17:
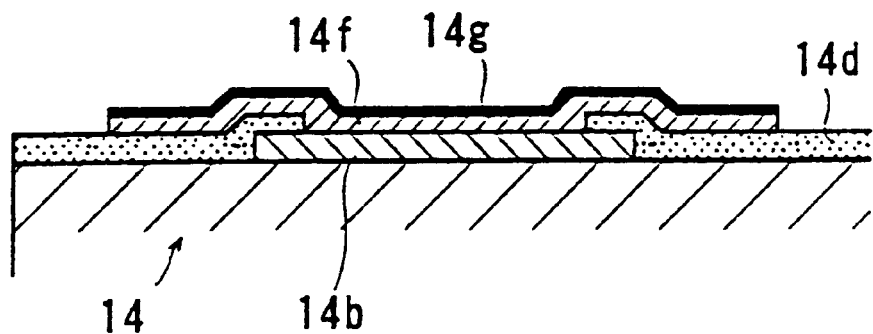
FIG. 17 is an illustrative view showing one part of a structure according to another embodiment of this invention.
Figure 18:
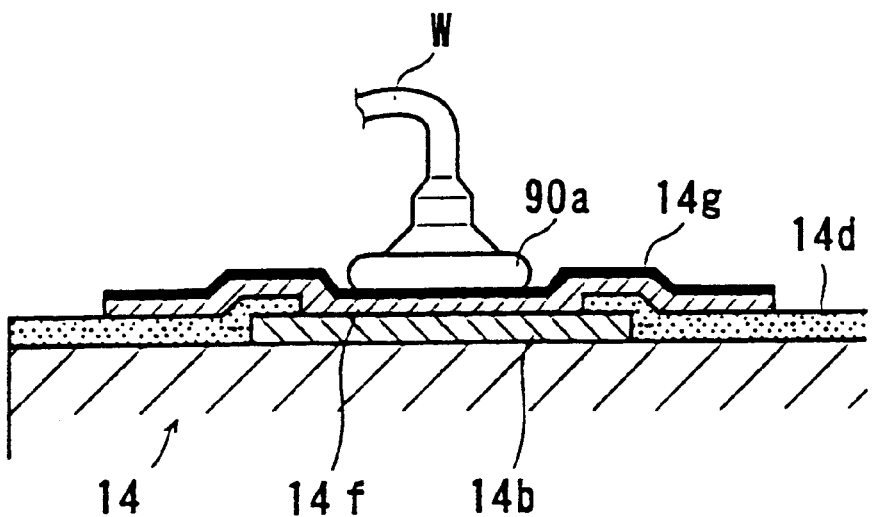
FIG. 18 is an illustrative view showing another part of the structure of the FIG. 17 embodiment.

Referring to FIG. 17 and FIG. 18, a semiconductor device 10 according to another embodiment is structured similarly to the embodiment of FIG. 1 to FIG. 6 except that a passivation film 14d is formed over the surface of the IC main chip 14 at an area excepting the electrode pad 14b, a barrier metal 14f is formed over the surface of the electrode pad 14b, and a thin metal film 14g is formed of gold over a surface of the barrier metal 14f, omitting duplicated explanations.

More specifically, the passivation film 14d covers a peripheral edge of the electrode pad 14b, while the barrier metal 14f completely covers over the electrode pad 14b. Consequently, the electrode pad 14b is partly covered by the passivation film 14d. A gold metal layer 14g is formed by flash plating over a surface of the barrier metal 14f. Incidentally, this barrier metal 14f is also of a two-layered structure having a titanium lower layer and a tungsten upper layer, or a chromium lower layer and a silver upper layer.

A metal wire W is bonded to the electrode pad 14b thus formed with the barrier metal 14f and the thin metal layer 14g, as shown in FIG. 18. That is, a gold ball 90a formed at one end of the metal wire W is depressed onto the electrode pad 14b, and connection is made therebetween. At this time, the metal film 14g is alloyed both with the barrier metal 14f and the metal wire W. This increases the bondability of the gold wire W to the barrier metal 14f.

A semiconductor device 10 according to another embodiment as shown in FIG. 19 to FIG. 24 is to explain this invention in view of a different aspect from the embodiment of FIG. 17 and FIG. 18.

Figure 19:
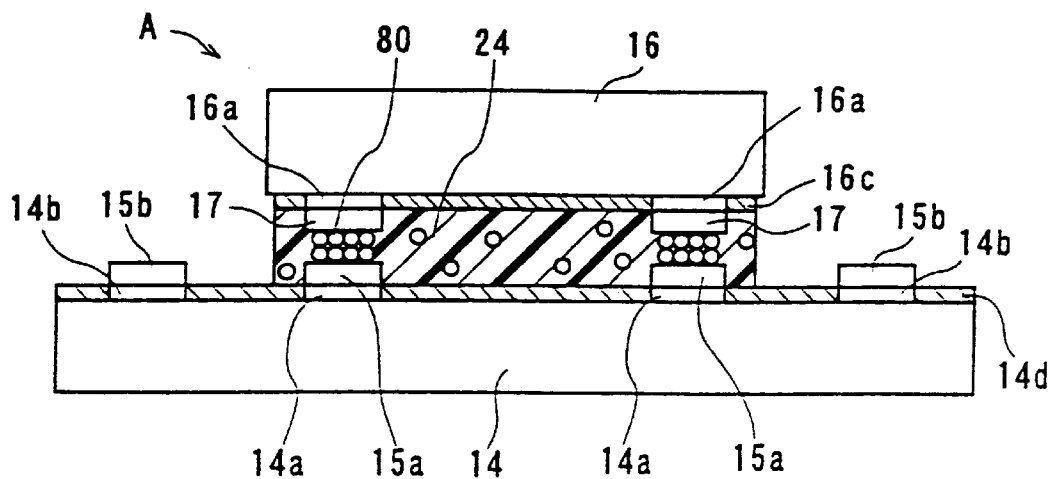
FIG. 19 is an illustrative view showing one part of a structure according to another embodiment of this invention.
Figure 20:
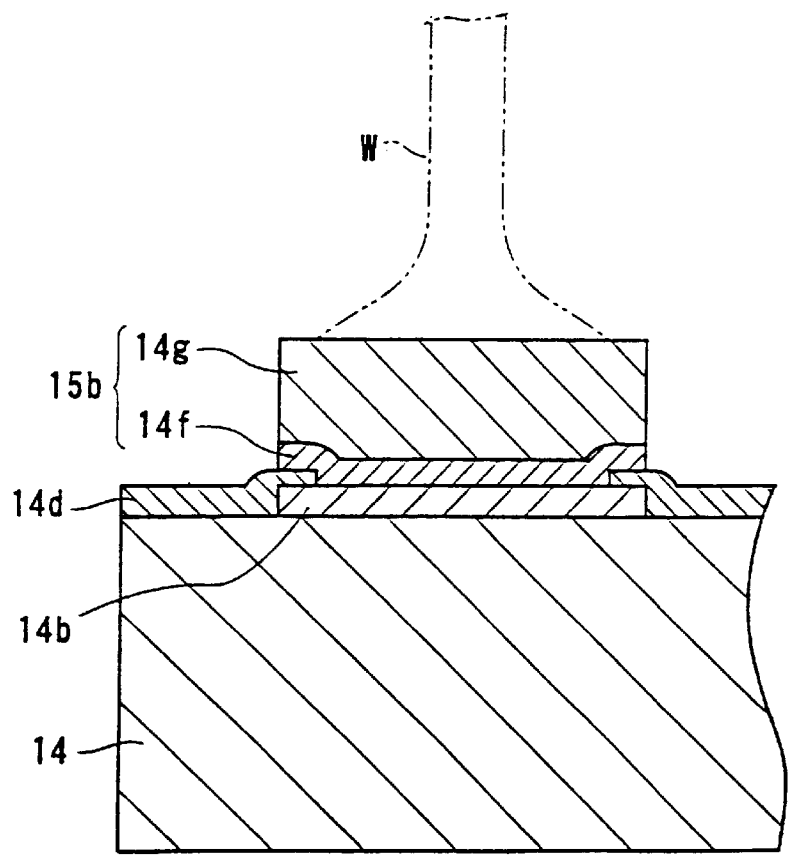
FIG. 20 is a magnification view showing one part of the FIG. 19 embodiment.

FIG. 19 is an essential-part sectional view showing one embodiment of stacked chips having a semiconductor-chip mount structure, while FIG. 20 is a partial magnification sectional view of a wire-bond terminal in the stacked chip structure A.

As shown in FIG. 19, the stacked chip structure A includes a first semiconductor chip (IC main chip) 14 and a second semiconductor chip (IC sub-chip) 16 stacked through an anisotropic conductive film 24. The first semiconductor chip 14 has, at a surface, electrode pads 14a as connecting terminals to the second semiconductor chip 16 and electrode pads 14b for wire bond. The second semiconductor chip 16 has, at a surface, electrode pads 16a as connecting terminals to the first semiconductor chip 14. The both chips 14, 16 has their opposite surfaces formed with insulating films (passivation films) 14d and 16c at areas except for the electrode pads 14a, 14b, 16a. The electrode pads 14a, 14b, 16a are aluminum pads respectively formed at surfaces with conductive protecting layers 15a, 15b, 17.

The anisotropic conductive film 24 is a film formed of an epoxy resin as an insulating resin, and contains conductive particles 24b dispersed there throughout. The conductive particles 80 existing between the conductive protecting layers 15a, 17 are subjected to compression by the respective protecting layers 15a, 17. The conductive particles 80, not sandwiched between the protecting layers 15a, 17, are still in a state of dispersed in the conductive film 24. Consequently, electrical connection is given only between the protecting layers 15a, 17 on the respective semiconductor chips 14, 16, while insulation is kept at other areas than between the protecting layers 15a, 17. The conductive particles 80 may employ metal spheres, resin balls plated with nickel or plated with gold further on the nickel plating.

The wire-bond terminal formed on the surface of the first chip 14 will be explained in detail with reference to FIG. 20. The electrode pad 14b has an insulating film 14d formed at an edge portion thereof. The pad 14b has further, at a surface, a conductive protecting layer 15b. The conductive protecting layer 15b is formed by a barrier metal layer 14f and a metal layer (bump) 14g formed thereon. The metal layer 14g of this embodiment is formed thicker than the metal layer 14g of the embodiment in FIG. 17 and FIG. 18, and serves as a bump. The barrier metal layer 14f is structured by a titanium layer and an overlying platinum layer (not shown). The metal layer 14g is of gold formed through electroplating or the like. The wire W is bonded to the metal layer 14g. Incidentally, the electrode pads 14a, 16a, as connecting terminals of the first chip 14 and the second chip 16, have respective conductive protecting layers 15a, 17 in a same structure.

The electrode pads 14a, 14b, 16a are respectively protected by their conductive protecting layers 15a, 15b, 17, and will not eroded by the epoxy-resin conductive film 24.

Figure 21:
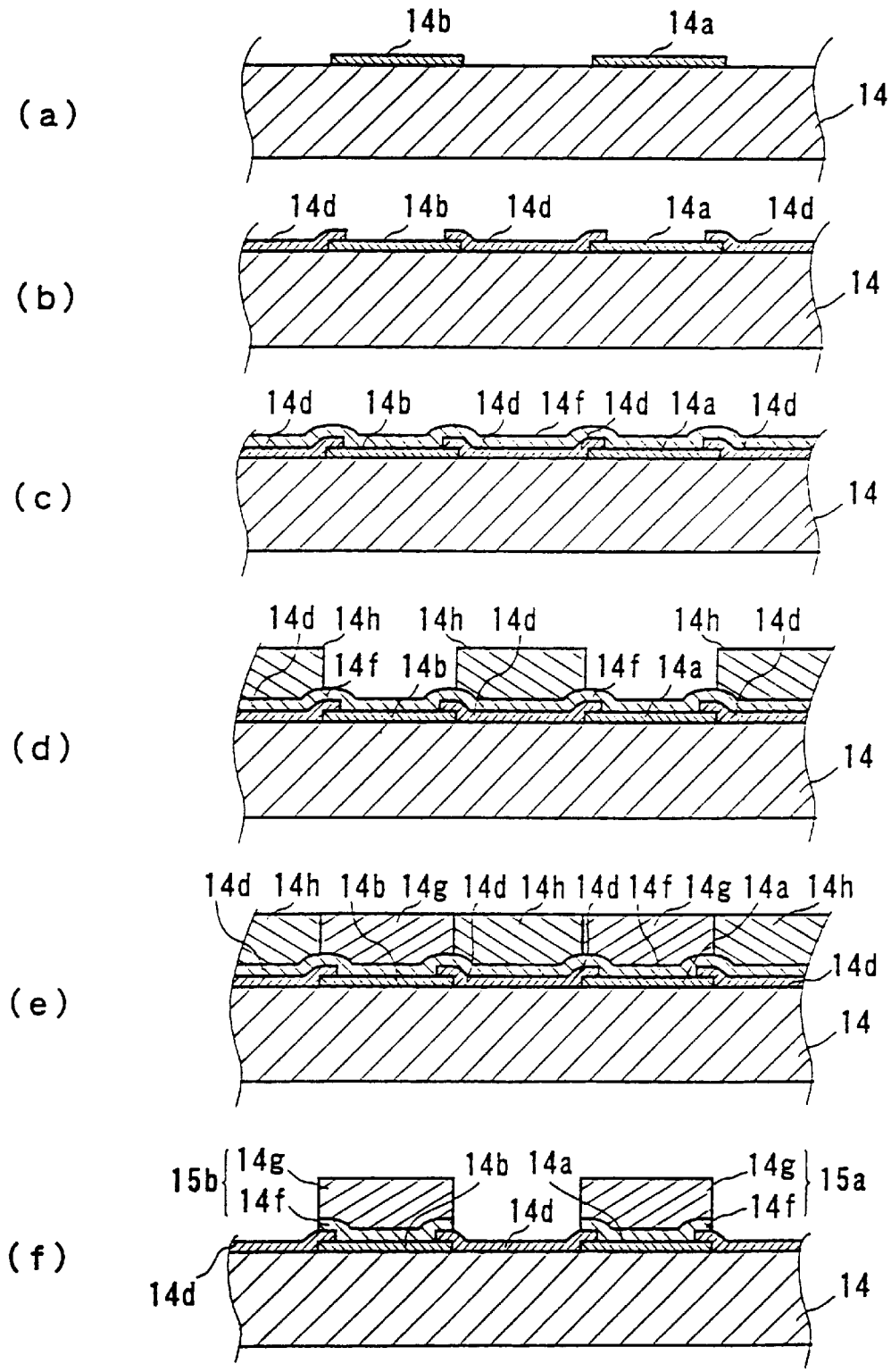
FIG. 21 is an illustrative view showing part of a manufacturing process for the FIG. 19 embodiment.

Now, a method for forming a conductive protecting layer will be briefly explained with reference to FIG. 21. First, circuit elements (not shown) are fabricated on a first chip 14 in a manner integral therewith, and electrode pads 14a, 14b are formed, together with predetermined interconnect patterns, to conduct the circuit elements as shown in FIG. 21(a). These electrode pads 14a, 14b are formed by providing an aluminum metal coating layer on the first chip 14 through, for example, a sputtering method or vacuum evaporation or the like, and then etching this metal coating layer.

As shown in FIG. 21(b), an insulating film 14d is formed to cover peripheral portions of the electrode pads 14a, 14b by, for example, a CVD technique or the like, for the purpose of protecting the circuit elements and interconnect patterns.

Then, a barrier metal layer 14f is formed to cover the electrode pad 14a, 14b and the insulating film 14d, as shown in FIG. 21(c). The barrier metal layer 14f has a titanium layer and an overlying platinum layer, wherein the titanium layer is formed to approximately 2000 Å and the platinum layer is to approximately 1000 Å. Incidentally, the barrier metal layer 14f is also formed, for example, by a sputtering method or vacuum evaporation.

Subsequently, a photo resist layer 14h is formed at an area excepting the area to be formed with a protecting layer 15a, 15b on the electrode pads 14a, 14b, as shown in FIG. 21(d). This photo-resist layer 14h is formed by providing a photo-sensitive resin layer on the barrier metal layer 14f and then exposing light to the resin layer using a predetermined mask to develop the photo-sensitive resin layer.

As shown in FIG. 21(e), a metal layer 14g of gold or the like is then formed at an area where no photo-resist layer 14h is formed, i.e., at a region to be formed with a conductive protecting layer 15a, 15b. This metal layer 14g is formed, for example, by electroplating or the like. That is, where forming a gold metal layer 14g by electroplating, the first chip 14 having the photo-resist layer 14h is immersed in a solution containing gold ions to supply electricity using the barrier metal layer 14f as a minus electrode. In such a case, gold grows on the barrier metal layer 14f at an area having no photo-resist layer 14h, thus providing a metal layer 14g.

As shown in FIG. 21(f), the photo resist layer 14h is stripped off to expose the insulating film 14d. In this manner, a metal layer 14g is formed as an electrode bump.

In this manner, the conductive protecting layer 15a, 15b is formed by the barrier metal layer 14f with the metal layer 14g which layers are formed simultaneously on the electrode pad 14a, 14b. Incidentally, the conductive protecting layer 17 is also formed on the electrode pad 16a in the same manner.

Now explanations will be made on a process of mounting a semiconductor chip having respective conductive protecting layers 15a, 15b on the electrode pads 14a, 14b.

Figure 22:
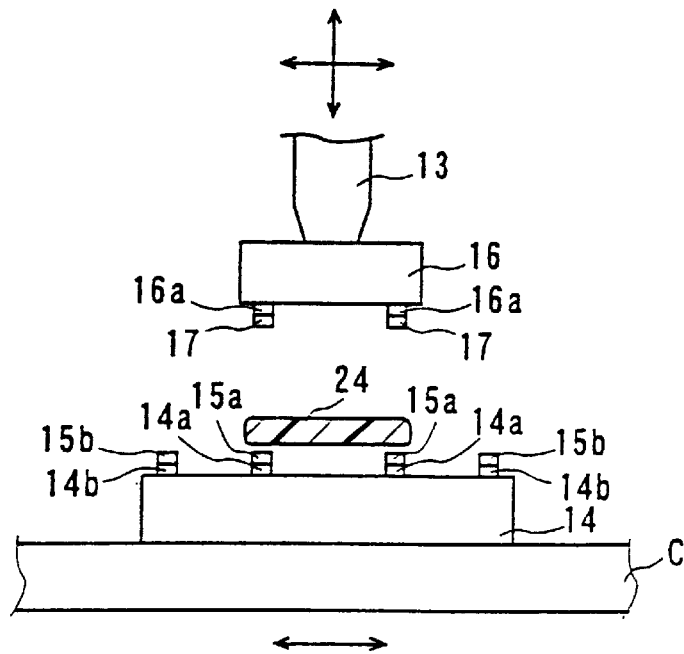
FIG. 22 is an illustrative view showing another part of the manufacturing process of the FIG. 19 embodiment.

As shown in FIG. 22, the electrode pads 14a and the overlying conductive protecting layers 15a formed on a first chip 14 are covered by a conductive film 24. Thereafter the conductive protecting layers 17 on the electrode pad 16a of the second chip 16 are opposed to the conductive protecting layers 15a by visual observation or the like. When the metal layer 14g (see FIG. 20) forming the conductive protecting layer 15a, 17 is of gold, the gold if covered by a milky-white conductive film 24 can be clearly recognized. Therefore, the chips 14, 16 when adhered to each other can be accurately positioned in position. Incidentally, the conductive film 24 is preferably a film based on an epoxy resin excellent in insulatability and adhesibility.

After facing the conductive protecting layer 17 and the conductive protecting layer 15a to each other, the second chip 16 is moved toward the first chip 14 by using a pressurizing device 13. The positioning of the chips 14, 16 immediately before adhesion can be determine by precisely adjusting of the carrier table C and the pressurizing device 13.

When the second chip 16 is depressed onto the first chip 14, a heater (not shown) built within the carrier table C is operated so that the conductive film 24 is melted to cover over the electrode pads 14a, 16a and the conductive protecting layers 15a, 17. The respective chips 14, 16 are adhered to each other in a state that the conductive film 24 is interposed in a thin film form therebetween, thus obtaining a stacked chip structure in a form of chip-on-chip (COC) mount.

After completing the mount process, a wire W is bonded to the conductive protecting layer 15b formed on the wire-bond electrode pad 14b. The bonding of the wire W is performed by thermo-compression bonding or ultrasonic bonding. After bonding the wire W, the wire is connected to a lead base plate or the like, providing a semi-processed semiconductor device. This semi-finished semiconductor device is packaged by a mold resin 22 into a semiconductor device 10.

Figure 23:
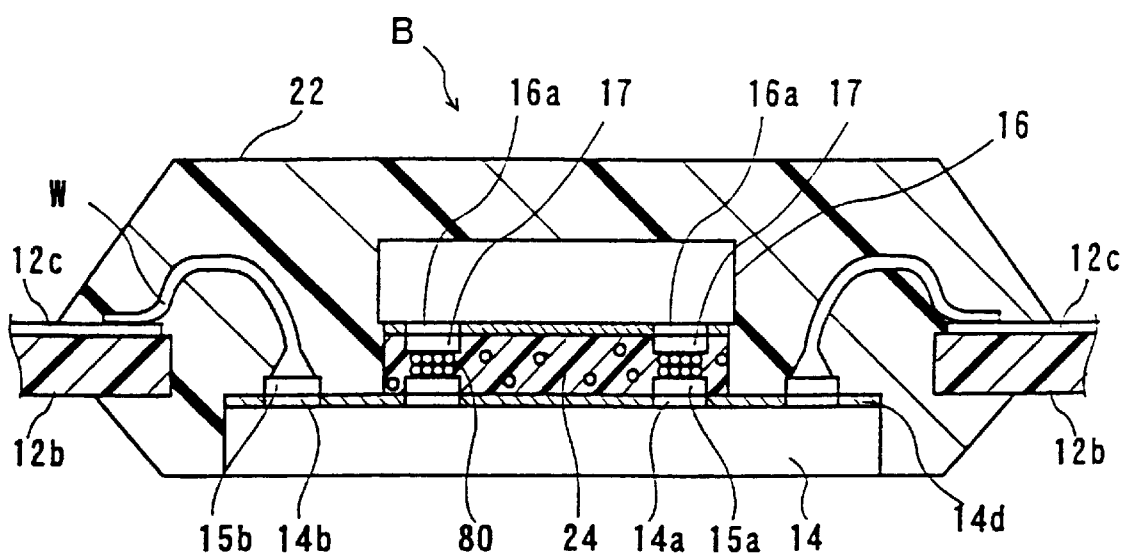
FIG. 23 is an illustrative view showing one part of a structure of the FIG. 19 embodiment.

FIG. 23 is an essential-part sectional view showing one embodiment of a semiconductor device 10 according to this invention. As shown in the FIG., the first chip 14 and the second chip 16 are adhered to each other through a conductive film 24. The conductive film 24 contains conductive particles 80 dispersed there throughout. The conductive particles 80 sandwiched between the conductive protecting layers 15a, 17 are in compression, while the conductive particles 80 not sandwiched by the conductive protecting layers 15a, 17 are in a state of dispersion within the conductive film 24. Consequently, the respective protecting layers 15a, 17 are electrically connected through the compressed conductive particles 80 with the other regions than between the respective protecting layers 15a, 17 kept in electrical insulation. The electrode pad 14b has the conductive protecting layer 15b thereon, and the conductive protecting layer 15b is connected to a conductive interconnect portion 12c provided on the lead terminal 12b through the wire W. The respective chips 14, 16 and the wires W are molded by a mold resin 22 into a resin package.

When molding the respective chips 14, 16 by a mold resin 22 into a package, the heat due to molding may cause the conductive film 24 to melt and flow toward the electrode pad 14b. However, the electrode pad 14b is protected by the conductive protecting layer 15b, and cannot be eroded by the conductive film 24.

In this embodiment, the conductive protecting layer 15b is provided by plating gold on the electrode pad 14b. However, the conductive protecting layer 15b may employ a conductive polymer material such as polyacetylene or the like. The electrical conductivity of polyacetylene can be controlled by adjusting an amount of a dopant (iodine, etc.) added thereto. The conductive protecting layer 15b is formed of at least one of conductive polymer materials selected from polythiazyl, polydiacetylene, polypyrrole, polyparaphenylene, plyparaphenylene sulfide, polyparaphenylene vinylene and polythiophene.

Polythiazyl is a metallic conductive polymer material that exhibits super conductivity at extreme low temperature. Polyacetylen and the others are polymer semiconductors that exhibit a property alike a semiconductor due to localization of π electrons resulting from conjugate double bonding. In these polymer semiconductors, the addition of various donors or acceptors causes the π electrons within molecules to move, resulting in a charge-transfer complex that is increased in electrical conductivity.

In this embodiment, the positioning in adhesion of the first chip 14 and the second chip 16 to each other was conducted by visual observation. Alternatively, the conductive protecting layers 15a, 17 can be accurately controlled in position by using a CCD imager or micro-computer.

Further, the anisotropic conductive film employed in this embodiment was an anisotropic conductive film formed of an epoxy resin. However, the structural form is of no importance provided that there is excellence in adhesibilty and insulatability. The anisotropic conductive film may employ an anisotropic conductive resin (ACR).

Figure 24:
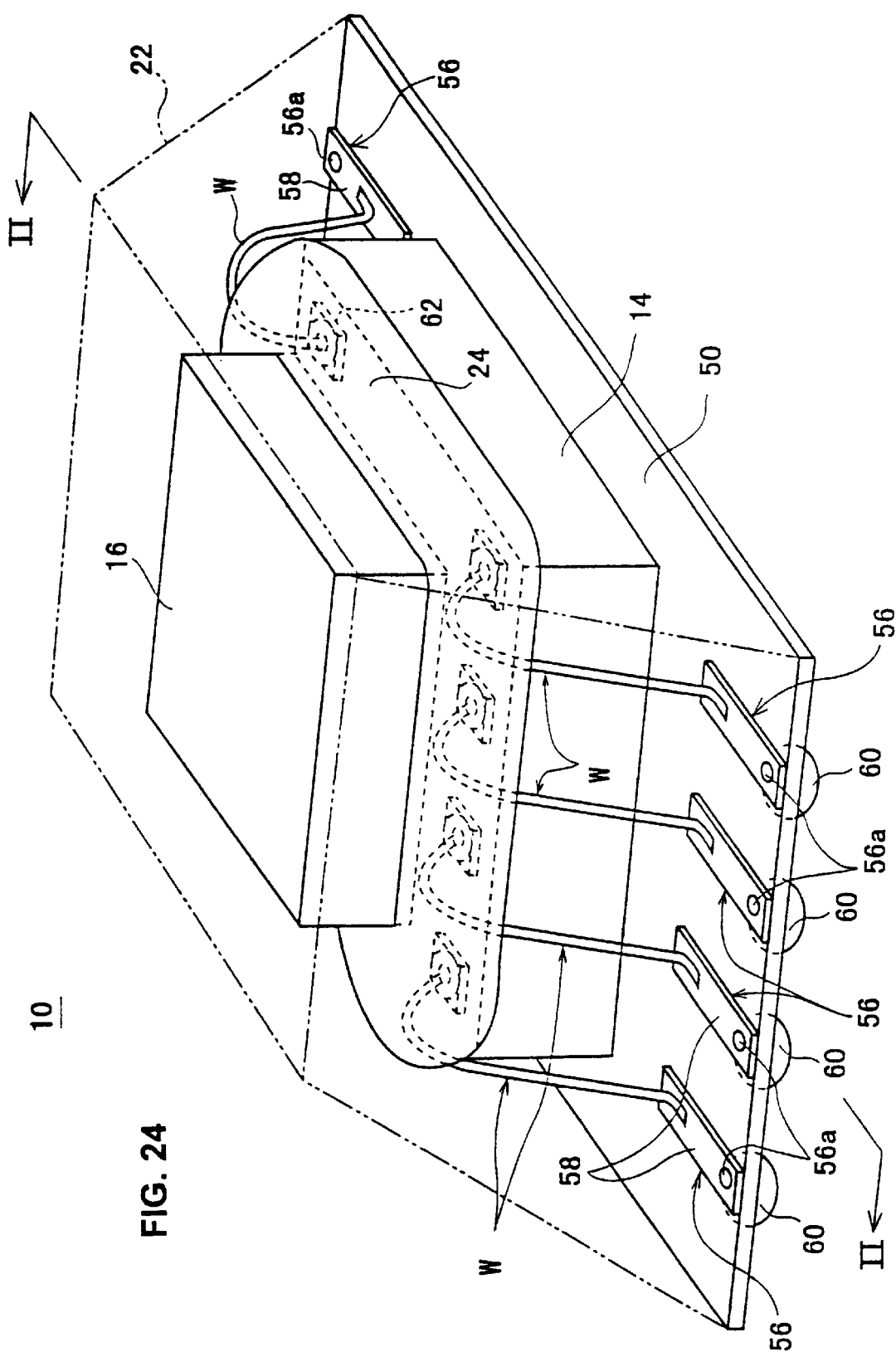
FIG. 24 is an illustrative view showing still another embodiment of this invention.

Referring to FIG. 24, a semiconductor device 10 according to another embodiment is generally structured by a film substrate 50 formed such as by a polyimide resin, a first semiconductor chip (IC main chip) 14 mounted on this film substrate 50, and a second semiconductor chip (IC sub-chip) 16 arranged in electrical connection to this first semiconductor chip 14.

Figure 25:
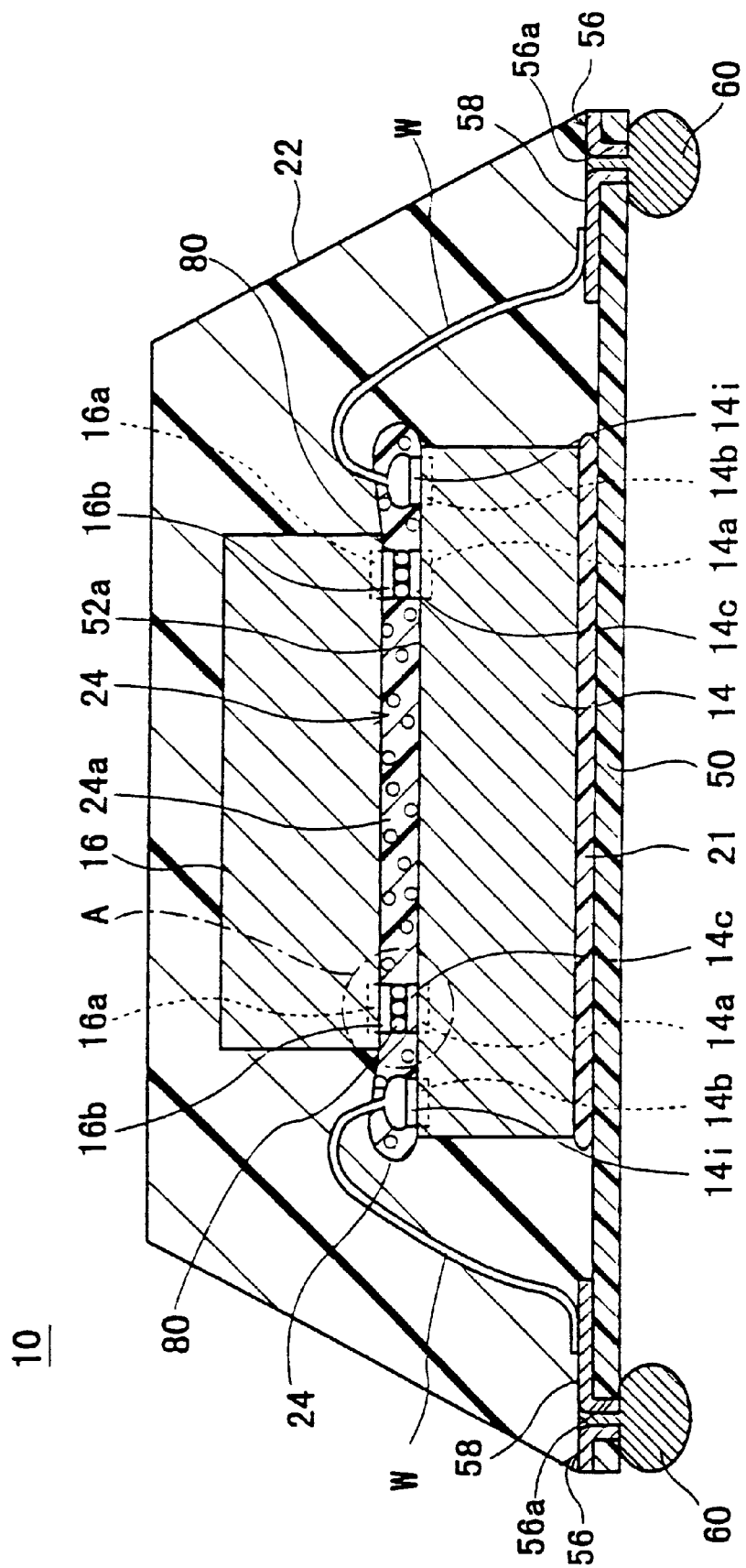
FIG. 25 is an illustrative view showing one part of the FIG. 24 embodiment.

As well represented in FIG. 24 and FIG. 25, the film base plate 50 has four through-holes 56a in respective opposite ends thereof. Terminals 56 are formed totally 8 in number at locations corresponding to those through-holes 56a. Each of the terminals 56 has a thin-filmed terminal portion 58 formed on a surface of the film base plate 50 and a ball terminal portion 60 formed at an backside of the film base plate 50, wherein the thin-film terminal portion 58 and the ball terminal portion 60 are of course electrically connected therebetween through the through-hole 56a.

Incidentally, the filmed terminal portion 58 is formed, for example, of copper or the like, while the ball terminal portion 60 is, for example, of solder. The forming location and the number of the through-holes 56a as well as the terminals 56 is a matter of appropriate design.

Figure 26:
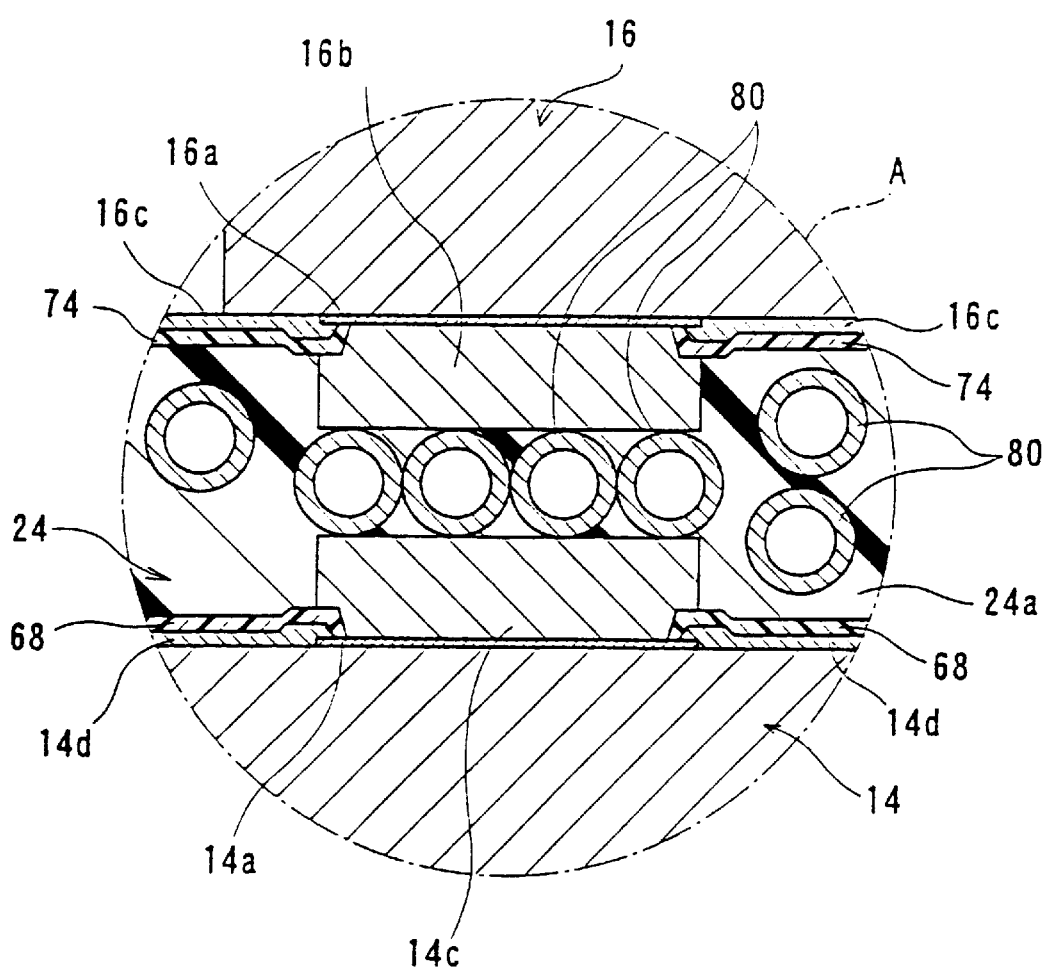
FIG. 26 is a magnification view showing one part of the FIG. 25 embodiment.

As well represented in FIG. 26, the first semiconductor chip 14 includes the electrode pads 14a, 14b respectively formed plural in number for connection to the circuit elements (not shown) fabricated on the semiconductor chip 14 in a manner integral therewith. Also, the passivation film (first protecting film) 14d is formed in a manner covering an area formed with the circuit elements. This passivation film 14d is formed such that the electrode pads 14a, 14b are exposed to the outside. Further, a synthetic resin film (second protecting film) 68 is formed over the passivation film 14d. This synthetic resin film 68 is also formed to expose the electrode pads 14a, 14b to the outside. The exposed electrode pads 14a, 14b has thereon respective bumps 14c, 14i formed of gold or the like. Also, the second semiconductor chip 16 has a plurality of electrode pads 16a connected to the circuit elements (not shown) fabricated integral with the chip. A passivation film 16c is formed in a manner covering the circuit elements, over which a synthetic resin film 74 is formed. The electrode pads 16a naturally have respective bumps 16b of gold.

The passivation film 14d (16c) is formed by growing a silicon oxide film on the semiconductor chip 14 (16) in a wafer form, by for example a CVD method. It is also possible to further grow a silicon nitride (Si3N4) film or the like on the oxide film so that the oxide film and the silicon nitride film constitute a passivation film 14d (16c). It is of course necessary to etch away the passivation film 14d (16c) at areas of the electrode pads 14a, 14b (16a) to expose these electrode pads.

The synthetic resin film 68 (74) is formed by adhering a film such as of an polyimide resin to the semiconductor chip 14 (16) in the wafer form. The synthetic resin film 68 (74) is also etched away at the areas of the electrode pads 14a, 14b (16a) to expose these electrode pads to the outside.

The bumps 14c, 14i (16b) are formed by performing, for example, gold plating to the semiconductor chip 14 (16) in the wafer form. Specifically, a resist layer is formed to expose the portions of the electrode pads 14a, 14b (16a) to the outside, to grow a gold layer at areas having no resist layer by an electroplating technique. Thereafter, the resist layer is stripped away.

As well represented in FIG. 24 and FIG. 25, the bump 14i on the first semiconductor chip 14 and the terminal 56 on the film base plate 50 are connected therebetween through a gold wire W, for electrical connection. The connections between the terminal 56 and one end of the gold wire W and between the bump 14i and another end of the gold wire W are performed by well-known thermo-sonic bonding or the like (details will be stated later).

As well represented in FIG. 25 and FIG. 26, the first semiconductor chip 14 and the second semiconductor chip 16 are connected through the anisotropic conductive film 24. That is, the bump 14c on the first semiconductor chip 14 and the bump 16b on the second semiconductor chip 16 are electrically connected through the conductive particles 80 dispersed in the resin film 24a of the anisotropic conductive film 24. These semiconductor chips 14, 16 are protected by a resin package 22 formed by molding with an epoxy resin or the like.

Now explanations will be briefly made on one example of a method for manufacturing the semiconductor device 10 shown in FIG. 24 to FIG. 26, with reference to FIG. 27 to FIG. 30.

First, thin-filmed terminal portions 58 are formed on a resin film 50a in an elongated form by forming a film such as copper, for example, by means of sputtering, evaporation or CVD and then etching the film. On the resin film 50A, the first semiconductor chip 14 is mounted. This process is performed by placing the first semiconductor chip 14 on the resin film 50a with a resin adhesive 84 in liquid or solid form applied to the resin film 50a or a surface of the first semiconductor chip 14. The resin adhesive 84 preferably employs a room-temperature-setting resin or an epoxy or phenol resin that is settable at almost a temperature of heating during wire bonding as stated later.

Figure 27:
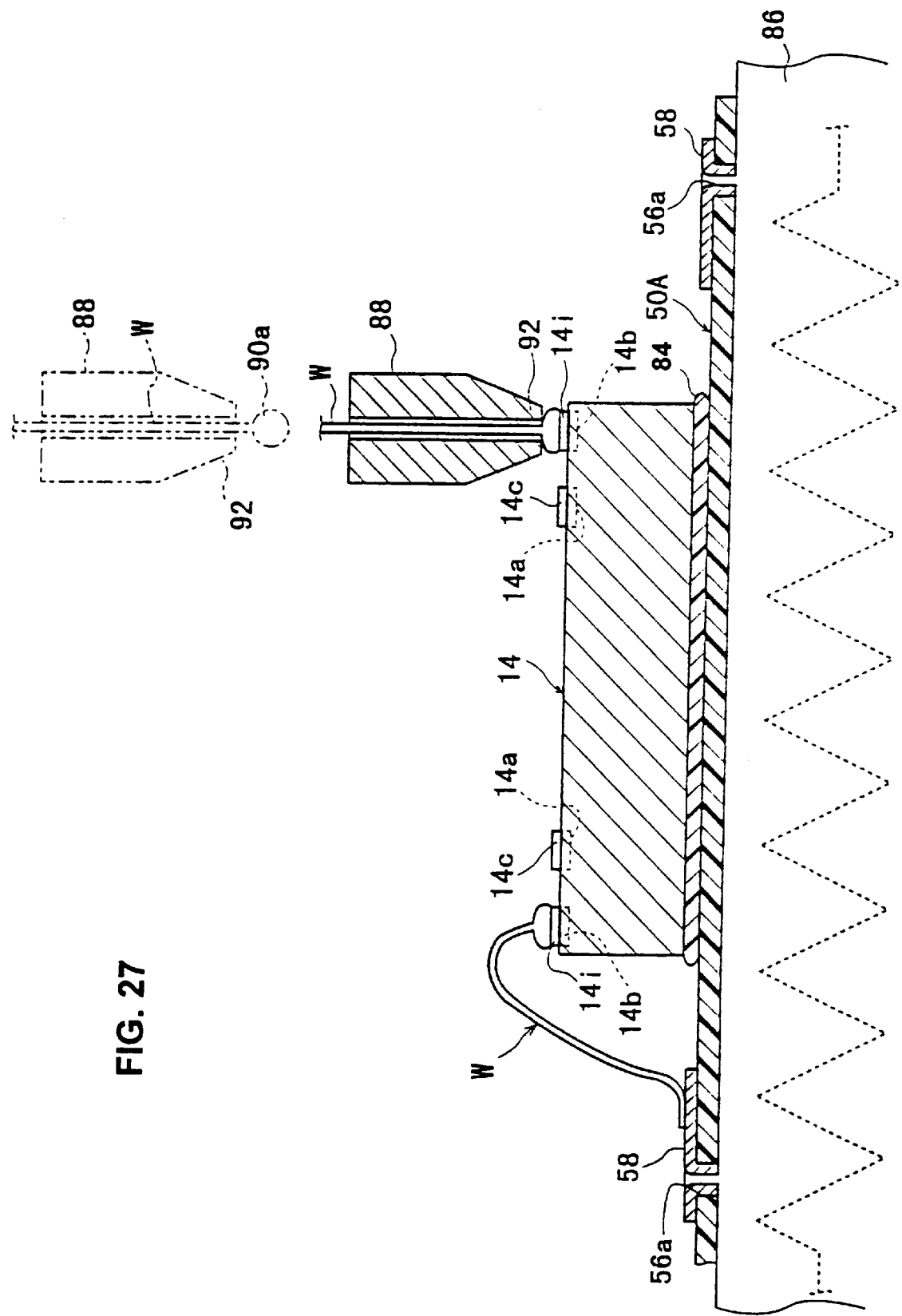
FIG. 27 is an illustrative view showing part of a manufacturing process for the FIG. 24 embodiment.
Figure 28:
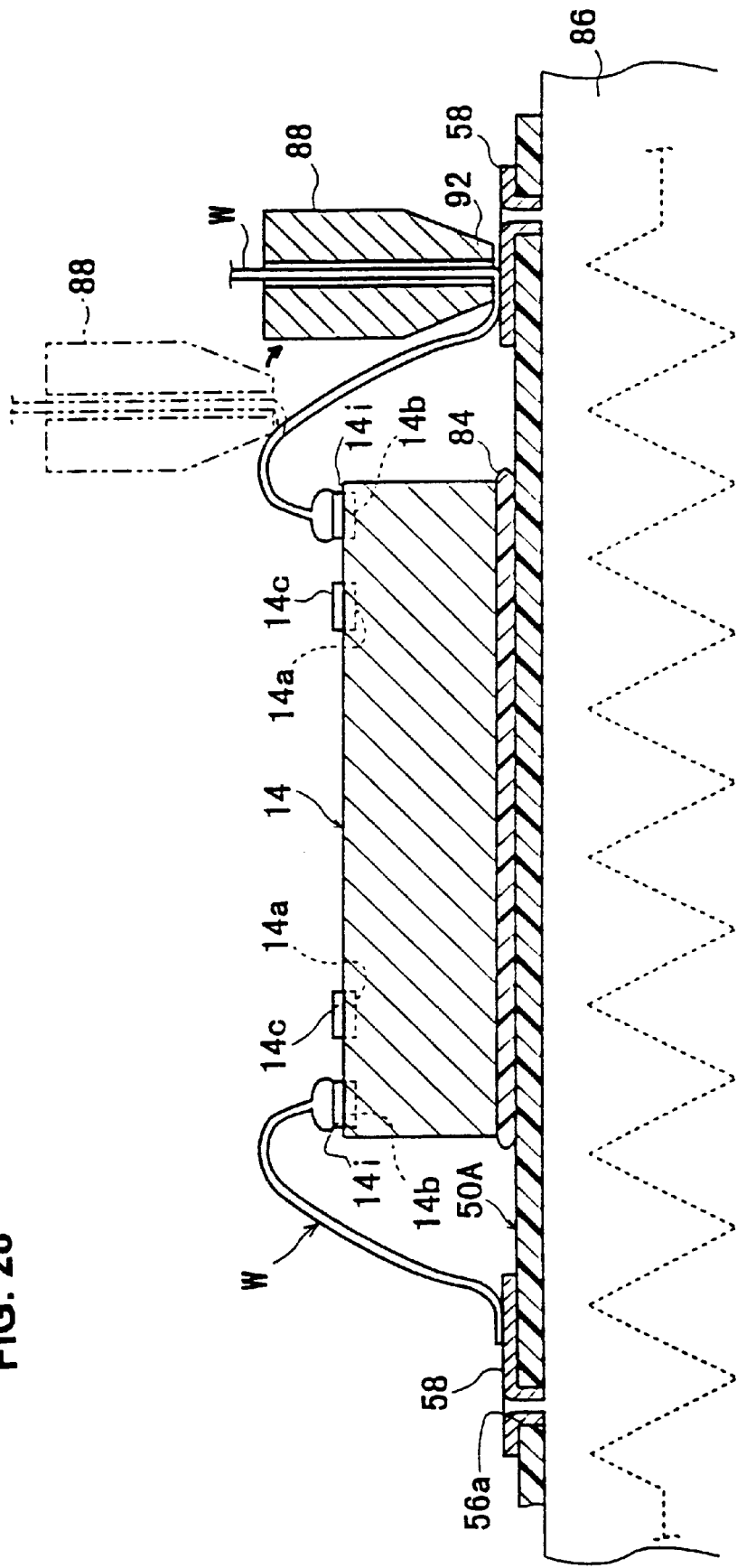
FIG. 28 is an illustrative view showing another part of the manufacturing process for the FIG. 24 embodiment.

Then, as shown in FIG. 27 and FIG. 28, the thin-filmed terminal portion 58 and the bump 14i of the first semiconductor chip 14 are connected therebetween through a gold wire W. This process is carried out by so-called thermo-sonic bonding. This thermo-sonic bonding is carried out, for example, by resting the resin film 50A on a table 86 and heating the resin film 50A and the first semiconductor chip 14 to approximately 200° C. through the table 86. This thermo-sonic bonding comprises first bonding as shown in FIG. 27 and a second bonding as shown in FIG. 28.

As well represented in FIG. 27, the first bonding is carried out by inserting a gold wire W through a tool, called a capillary 88, to project its tip from a tip portion 92 of the capillary 88, heating and melting the gold wire W tip with hydrogen flame or electrical discharge to form a gold ball 90a, and moving the capillary 88 and pressing and fixing the gold ball 90a onto the bump terminal 14i. It is of course possible to supply ultrasonic vibration to a fixing portion during depression of the gold ball 90a. As well represented in FIG. 28, the second bonding is performed by moving the capillary 88 to a location of the thin-filmed terminal portion 58 of the resin film 50A while drawing out the gold wire W in a state that the tip of the gold wire W is fixed, and supplying ultrasonic vibration while depressing the gold wire W onto an upper surface of the thin-filmed terminal portion 58 by a tip portion 92 of the capillary 88. When the gold wire W is adhered, the capillary 88 is moved to forcibly cut the gold wire W, thus completing the wire-bonding process.

Figure 29:
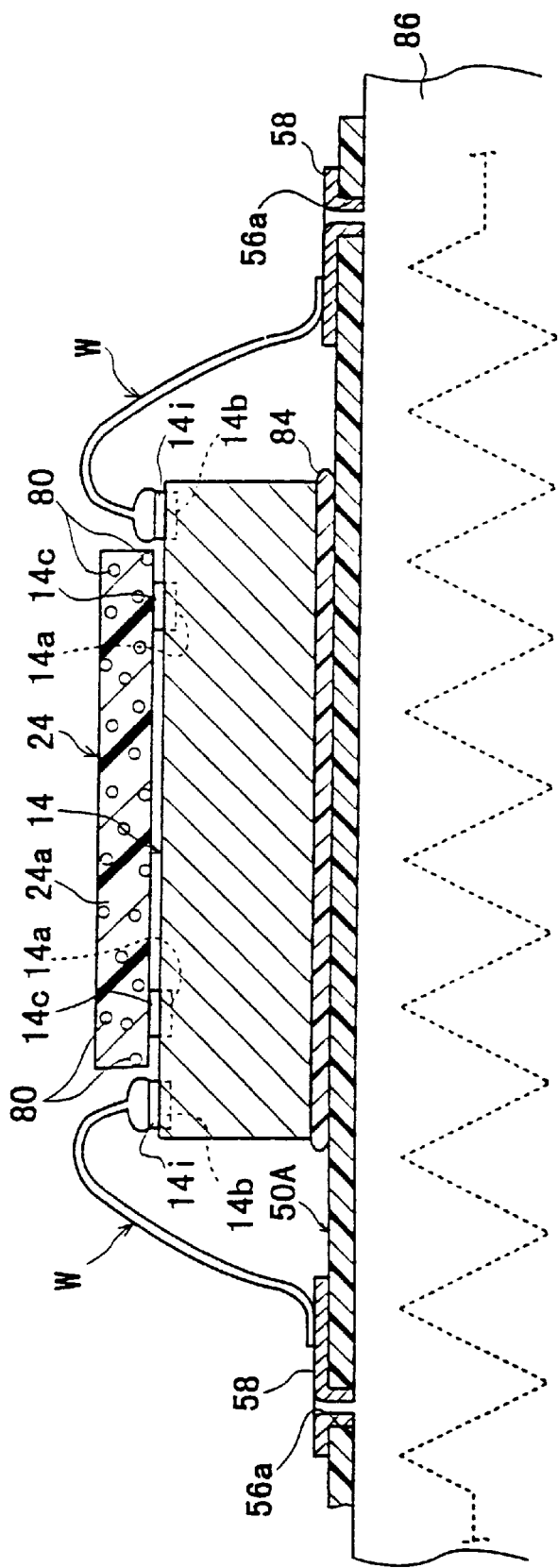
FIG. 29 is an illustrative view showing still another part of the manufacturing process for the FIG. 24 embodiment.

Then, as shown in FIG. 29, an anisotropic conductive film 24 in a piece form is rested on a surface of the first semiconductor chip 14 that is placed, together with the resin film 50a, on the table 86 and heated up. This anisotropic conductive film 24 contains conductive particles dispersed throughout a thermo-setting resin film 24a such as of epoxy. That is, the anisotropic conductive film 24 is in a film form before being placed onto the first semiconductor chip 14, but the resin film 24a is softened and melted by the heat given from the preheated first semiconductor chip 14 when rested on the first semiconductor chip 14. Incidentally, it is possible to use a resin in a liquid form at normal temperature and contains conductive particles dispersed therein, in place of the anisotropic conductive film 24.

Figure 30:
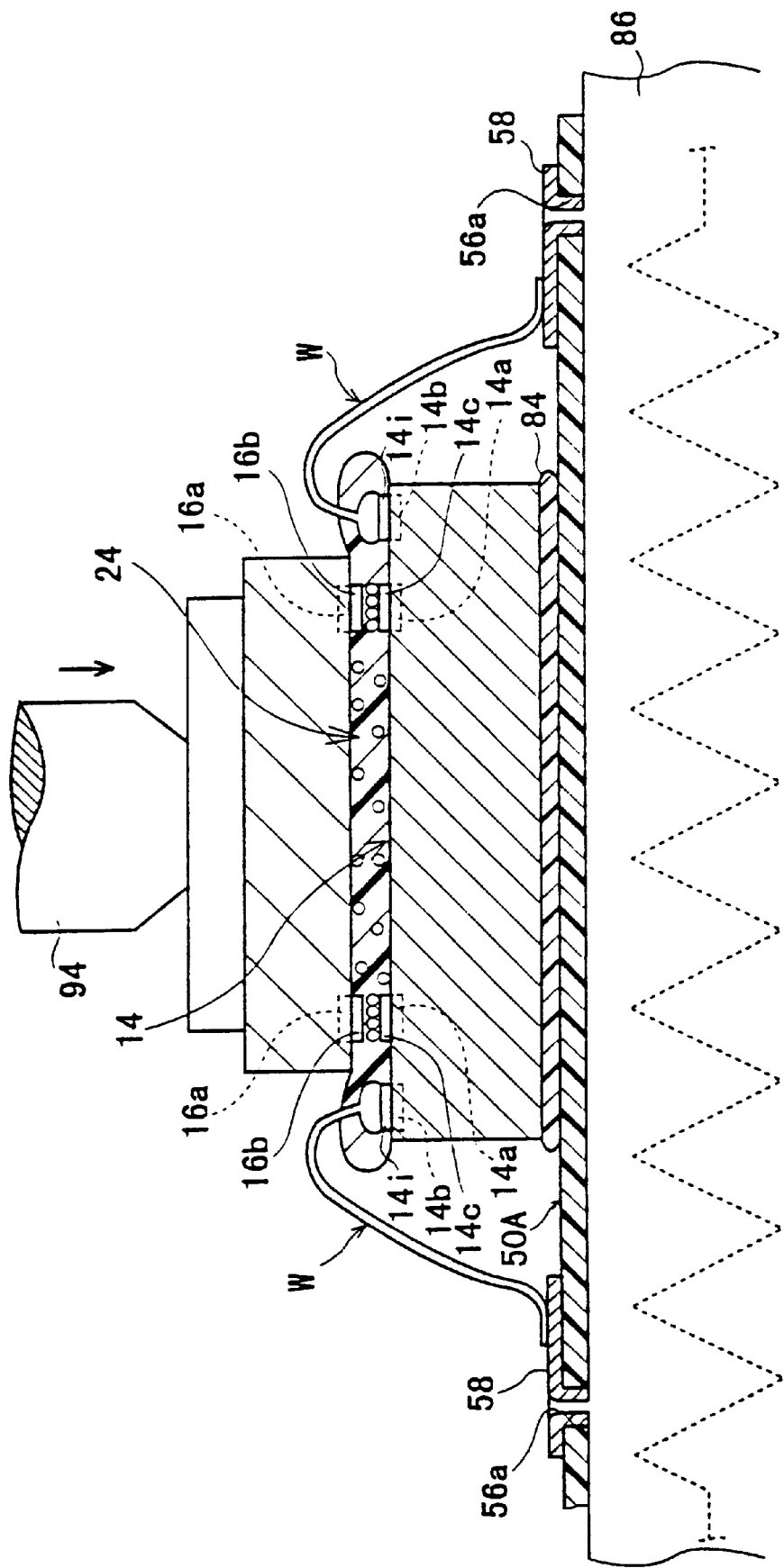
FIG. 30 is an illustrative view showing yet another part of the manufacturing process for the FIG. 24 embodiment.

Subsequently, as shown in FIG. 30, the bump 16b on the second semiconductor chip 16 is opposed to the bump 14c of the first semiconductor chip 14 while positioning the second semiconductor chip with using a suction collet 94. The second semiconductor chip 16 is then depressed against the first semiconductor chip 14. At this time, the resin film 24a is being softened and melted and selectively compressed at between the bump terminals 14c, 16b. As a result, the bump terminals 14c, 16b are electrically connected through an interposition of conductive particles 80 between these bump terminals 14c, 16d. On the other hand, the resin film 24a is still being applied by heat from the first semiconductor chip 14, and ultimately set. At this time, the resin film 24a is contracted due to setting, which mechanically joins between the semiconductor chips 14, 16. Incidentally, ultrasonic vibration may be applied to the second semiconductor chip 16 during depressing the first semiconductor chip 14 against the second semiconductor chip 16. In such a case, the bump terminals 14c, 16b and the conductive particles 80 are electrically connected with reliability by vibrational friction due to ultrasonic vibration thus applied.

Then, though not shown, a resin package 22 is formed to cover the first and second semiconductor chips 14, 16 and the gold wires W. This resin package 22 is formed by mold forming using, for example, an epoxy resin. Then, ball terminal portions 60 are formed of solder or the like at backside locations where the through-holes 56a are formed through the resin film 50a. By cutting out of the resin film 50a, a semiconductor device as shown in FIG. 24 and FIG. 25 is obtained.

In the semiconductor chips 14, 16 structured as above, the passivation film 14d, 16c is covered by the synthetic resin film 68, 74. This reduces the effect of a depressing force applied during joining between the semiconductor chips 14, 16. That is, there is less possibility of occurring partial stripping or cracking the passivation film 14d, 16c due to such depressing force.

Also, where the synthetic resin film 68, 74 is formed of a polyimide resin that is comparatively strong against heat and external forces, if the passivation film 14d, 16c should be damaged due to a depression force or the like, the synthetic resin film 68, 74 can maintain its state desirably covering over the passivation film 14d, 16c. That is, when the passivation film 14d, 16c is damaged, the protection for the circuit elements is given by the synthetic resin film 68, 74. Therefore, there is no possibility that the semiconductor chip 14, 16 is damaged of its characteristic by oxidation to the circuit elements or the like, unless the synthetic resin film 68, 74 is fractured.

Consequently, the semiconductor device 10, having semiconductor chips 14 and 16 joined to each other appropriately, maintains the characteristics of the semiconductor chips 14 and 16. Moreover, even where any external force be applied to the semiconductor device 10, the synthetic resin film 68, 74 serves to reduce an influence on the passivation film 14d, 16c. If the passivation film 14d, 16c should be damaged, the synthetic resin film 68, 74 serves to maintain a state that the circuit elements on the semiconductor chips 14, 16 are protected.

Figure 31:
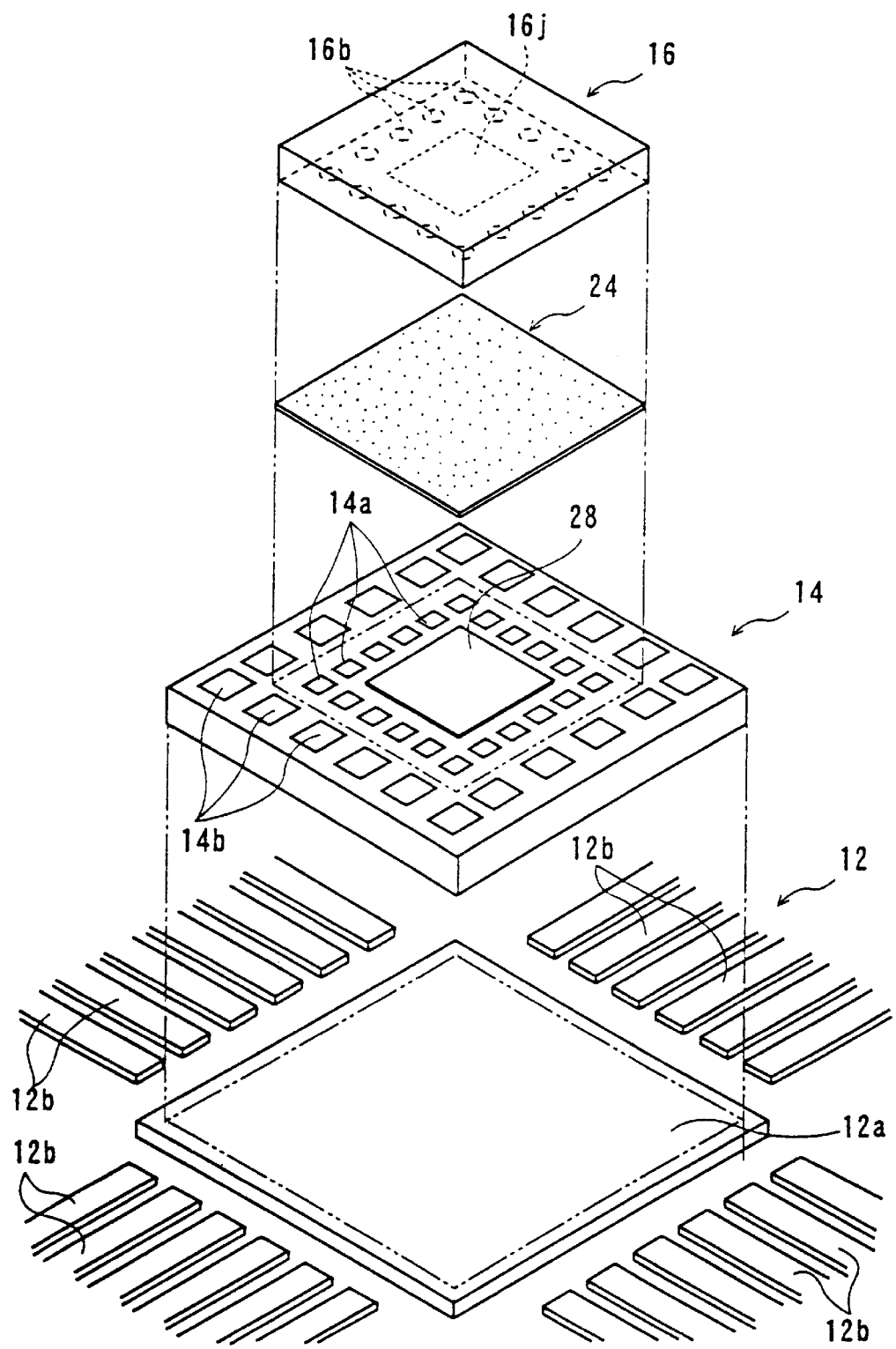
FIG. 31 is an illustrative view showing another embodiment of this invention.

Referring to FIG. 31, a semiconductor device 10 according to another embodiment is structured similarly to the embodiment of FIG. 7 to FIG. 8 except that a soft-property film 28 of a silicon resin or the like is adhered to an inner side of the electrode pads 14a formed on the surface of the IC main chip 14, omitting duplicated explanations.

Figure 32:
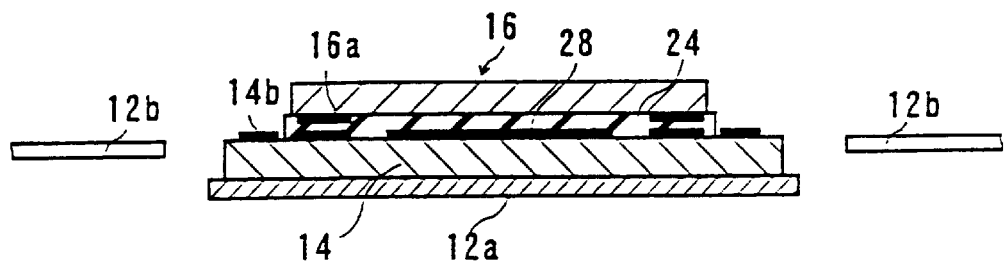
FIG. 32 is an illustrative view showing one part of a structure of the FIG. 31 embodiment.

Interposing an anisotropic conductive film 24 between the IC main chip 14 and the IC sub-chip 16, the IC sub-chip 16 is depressed onto the IC main chip 14. Thus, the conductive film 24 is adhered to the both IC chips 14, 16, as shown in FIG. 32. As a result, the conductive film 24 at compressed and deformed portions exhibits electrical conductivity in a thickness direction and hence electrical connection is provided between the electrode pad 14a and the electrode pad 16a through the conductive film 24.

Here, the electrode pad 16a is formed at an peripheral area on the IC chip 16, and the bump 16b is also formed at an peripheral area on the IC chip 16. However, the soft-property film 28 is adhered to an inner side of the electrode pad 16a. Consequently, if an external force is applied to an inner side with respect to the bump 16b, there is no warp in the IC chip 14 or 16. It is therefore possible to positively reduce breakage in the IC chips 14, 16 or damage to the circuit elements due to an increase size of the IC chips 14, 16.

Incidentally, although in this embodiment the bumps 16b were provided on the side of the electrode pads 16a and a soft-property film 28 is adhered to the IC chip 14, the bumps 16b may be provided on the electrode pads 14a or both the electrode pads 14a and 16a. Also, the soft-property film 28 may be adhered to the IC chip 16 or both the IC chips 14 and 16.

Figure 33:
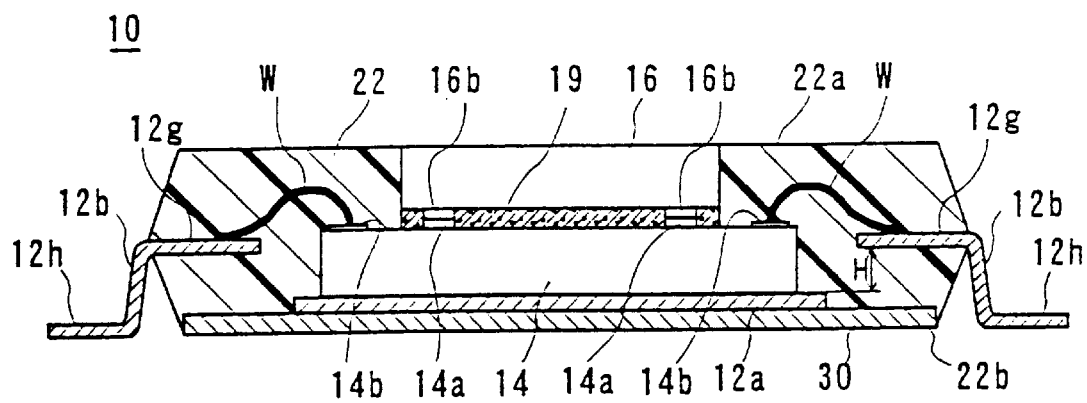
FIG. 33 is an illustrative view showing another embodiment of this invention.
Figure 34:
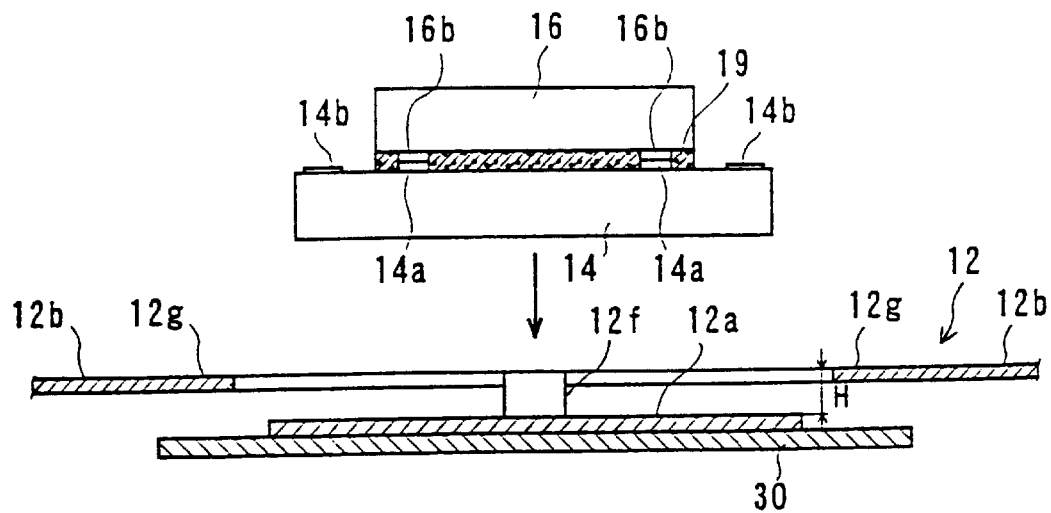
FIG. 34 is an illustrative view showing one part of a structure of the FIG. 33 embodiment.
Figure 35:
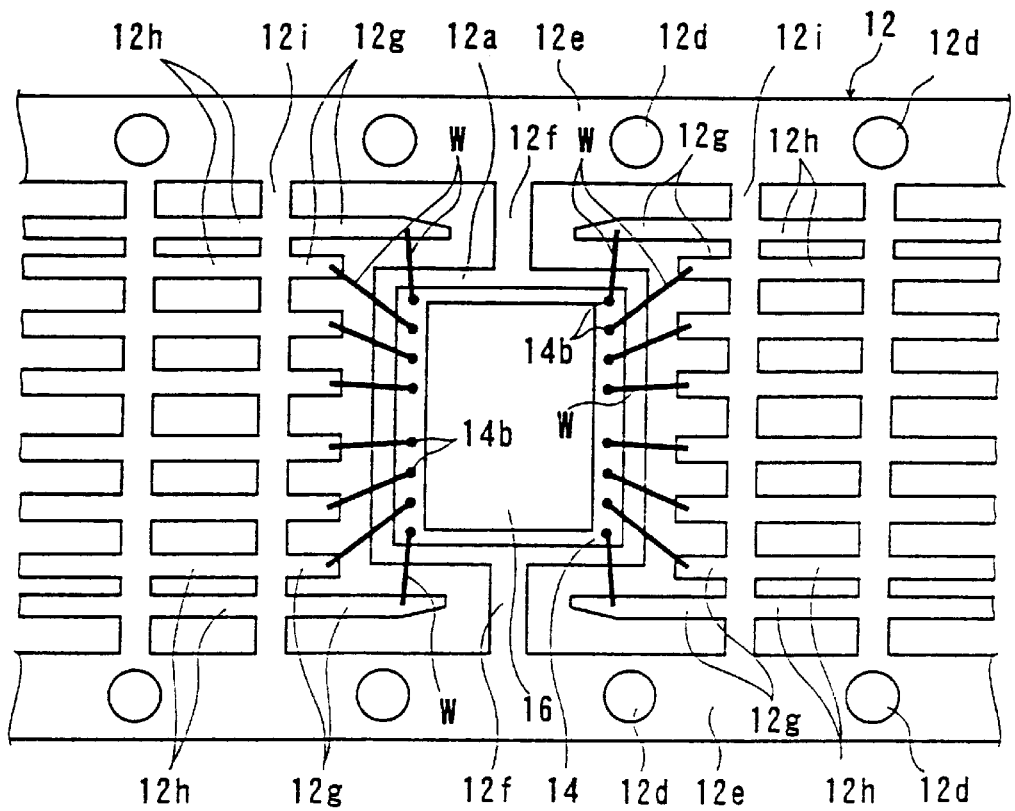
FIG. 35 is an illustrative view showing another part of the structure of the FIG. 33 embodiment.

FIG. 33 is a sectional view showing a resin-packaged semiconductor device 10 according to still another embodiment. FIG. 34 is an essential-part sectional view showing a manufacturing process for the resin-packaged semiconductor device 10 shown in FIG. 33. FIG. 35 is an essential-part plan view showing a manufacturing process for the resin-packaged semiconductor device shown in FIG. 33.

In FIG. 33, this resin-packaged semiconductor device 10 is structured by including a first semiconductor chip 14, a second semiconductor chip 16, a base plate (die pad) 12a on which these two semiconductor chips 14, 16 are to be mounted, a heat sink 30, a plurality of lead terminals 12b, a plurality of wires W, and package resin 22.

The resin-packaged semiconductor device 10 is manufactured by using a leadframe 12, wherein the die pad 12a and the lead terminals 12b are provided on the leadframe 12. Although a method for manufacturing the resin-package semiconductor device 10 is stated later, the die pad 12a is formed by a thin-walled metal sheet such as of copper, for example, in a rectangular form as viewed in plan. The lead terminals 12b are formed from a thin-walled metal sheet such as of copper similarly to the die pad 12a, and each comprise an inner lead 12g embedded within the package resin 22 and an outer lead 12h projecting outward from the package resin 22. The lead terminals 12b are for mounting the resin-packaged semiconductor device 10 on a desired position. Specifically, the resin-packaged semiconductor device 10 is placed on an area applied with a solder cream in a manner contacted by the lead terminals 12b, and then the solder cream is heated to cause solder reflow. Thus, the resin-packaged semiconductor device 10 can be surface-mounted on that area.

The first semiconductor chip 14 and the second semiconductor 16 are structured, for example, as an LSI chip or other IC chips, and have one surface on which desired electronic circuits (circuit elements) are fabricated integral therewith. Consequently, the surfaces of the first semiconductor chip 14 and the second semiconductor chip 16 are active surfaces fabricated with electronic circuits, while the backsides, i.e., the back surfaces of the silicon chips having no electronic circuits, are passive surfaces. The first semiconductor chip 14 is provided, on the active surface, with a plurality of bumps 14a and a plurality of electrode pads 14b. The electrode pads 14b are respectively connected to a plurality of lead terminals 12b through wires W such as gold wires. On the other hand, the second semiconductor chip 16 has, on the active surface, a plurality of bumps 16b corresponding to the bumps 14a.

The first semiconductor chip 14 is adhered at its passive surface onto a surface of the die pad 12a through an adhesive, etc. with the active surface positioned upward. The second semiconductor chip 16 is smaller in size than the first semiconductor chip 14, and stacked on the first semiconductor chip 14 with the passive surface positioned upward. The second semiconductor chip 16 at its active surface is adhered to the active surface of the first semiconductor chip 14 through an anisotropic conductive adhesive 19 or anisotropic conductive film. The anisotropic conductive adhesive 19 or anisotropic conductive film is an adhesive or film containing particles having electrical conductivity dispersed throughout an insulating material, so that it possesses electrical conductivity only at regions exerted by pressure due to the bumps or the like. Consequently, the bumps 14a of the first semiconductor chip 14 and the bumps 16b of the second semiconductor chip 16 are electrically connected with each other through an anisotropic conductive adhesive 19 or anisotropic conductive film. Thus, the two semiconductor chips 14 and 16 are combined with each other in electrical connection.

The heat sink 30 is formed by a metallic plate member, for example, in a rectangular form in plan, and larger in size than the die pad 12a in order to provide a great heat radiating area. This heat sink 30 is joined to an underside of the die pad 12a by means of ultrasonic welding, spot welding or others.

The package resin 22 is, for example, a thermo-setting epoxy resin, and formed to cover peripheral portions of the two semiconductor chips 14, 16 positioned above the heat sink 30 and bonding positions with the wires W. It is noted that this package resin 22 at its top surface 22a is in a height generally in flush with the upwardly-directed passive surface of the second semiconductor chip 16 such that the passive surface is generally entirely exposed to the outside. Similarly, the package resin 22 has a back surface 22b in a height generally in flush with the backside of the heat sink 30 so that the heat sink 30 at its backside is generally entirely exposed to the outside.

The resin-packaged semiconductor device 10 is manufactured by a process as stated below. That is, a leadframe 12, for example, as shown in FIG. 34 and FIG. 35 is employed in the manufacturing process for the resin-packaged semiconductor device 10. This leadframe 12 is formed, for example, by press-blanking a metal sheet, for example, of copper, and in an elongated form extending in a given direction. This leadframe 12 is basically structured common to the structure of the usual leadframe as conventionally used in the manufacture of semiconductor devices, except for the points stated later. Specifically, as well represented in FIG. 35, this leadframe 12 is formed with a plurality of die pads 12a at a given interval in an elongated direction between two strips of side edges 12e, 12e each having a multiplicity of feed holes 12d at a fixed interval, in order to mount semiconductor chips. The leadframe 12 is provided with support leads 12f for supporting the die pads 12a, a plurality of inner leads 12g provided at locations separated from the die pad 12a, and a plurality of outer leads connected to the respective inner leads 12g through tie bars 12i.

It is noted, as well represented in FIG. 33 and FIG. 34, that the die pad 12a has an upper surface lower in height by an appropriate dimension H than upper surface of the lead terminals 12b. In this manner, if the height of the die pad 12a is lower than that of the lead terminal 12b, when two semiconductor chips 14, 16 are vertically stacked and mounted on the die pad 12a, it is possible to reduce the total height at a position mounted with the semiconductor chips 14, 16 by an amount corresponding to the reduction in height of the die pad 12a. Thus, the resin-packaged semiconductor device 10 is preferably reduced in the overall thickness.

As shown in FIG. 35, the first semiconductor chip 14 and the second semiconductor chip 16 are placed and adhered onto the die pad 12a of the lead frame 12. In such a case, it is preferred that these semiconductor chips 14 and 16 are previously assembled with each other and then placed on the die pad 12a with using a chip bonder. This can reduce the number of steps in placing the semiconductor chips on the die pad 12a. This also makes it possible to check on whether the two semiconductor chips 14, 16 are appropriate in their electrical connection or not, at a stage prior to placing the semiconductor chips on the die pad 12a. Thus an advantage is available that poorly connected semiconductor chips 14, 16 are avoided in advance to their placement on the die pad 12a.

After mounting the first semiconductor chip 14 and the second semiconductor chip 16 on the die pad 12a, wire-bond connection is made between the pad electrodes 14b on the first semiconductor chip 14 and the inner leads 12g of the lead terminals 12b through using wires W, as shown in FIG. 35. Then, molding is made for the package resin 22, for example, by utilizing a transfer-molding technique, thus performing a resin package process to encapsulate the two semiconductor chips 14, 16 and their peripheral portions. After completing the resin package operation, forming operations are made to remove away unwanted portions of the leadframe 12 and bend the lead terminals 12b. Through these series of operating processes, a resin-packaged semiconductor device 10 is obtained.

Now explanations will be made on the operation of the resin-packaged semiconductor device 10.

First, the resin-packaged semiconductor device 10 has the two semiconductor chips 14, 16 molding in one package. Consequently, these semiconductor chips 14, 16 tend to have an increased total heat generation, as compared to a case that molds only one semiconductor chip in a resin package. However, the second semiconductor chip 16 at its passive surface is exposed out of the package resin 22. The heat generated by this second semiconductor chip 16 can be effectively released through this passive surface to the outside. Further, the heat sink 30, which is connected to the first semiconductor chip 14 through the die pad 12a, is also exposed at its backside out of the package resin 22. Therefore, the heat generated by this first semiconductor chip 14 can be released outside through the heat sink 30. Thus, the resin-packaged semiconductor device 10 has a good heat radiation characteristic, which suppresses the temperature from rising during operating the semiconductor chips 14, 16 and stabilizes the operation of the electronic circuits built on the semiconductor chips 14, 16.

On the other hand, exposed to the outside of the package resin 22 are only the heat sink 30 and the passive surface of the second semiconductor chip 16. If these portions are exposed to the outside, the semiconductor chips 14, 16 will not suffer serious damages. Since the active surfaces having preciously-formed electronic circuits of the two semiconductor chips 14, 16 are facing to each other and appropriately protected by the package resin 22, these portions are less suffered from damages. Also, in the resin-packaged semiconductor device 10, the two semiconductor chips 14, 16 are mutually electrically connected through the bumps 14a, 16b, and accordingly eliminate the necessity of wire-bond connections to the lead terminals 12b chip by chip. Consequently, the mere wire-bond connections of the electrode pads 14a of the first semiconductor chip 14 to the lead terminals 12b provide electrical connection of the two semiconductor chips 14, 16 to the lead terminals 12b, thus reducing the wire-bonding operating processes and enhancing the manufacture operation efficiency.

Figure 36:
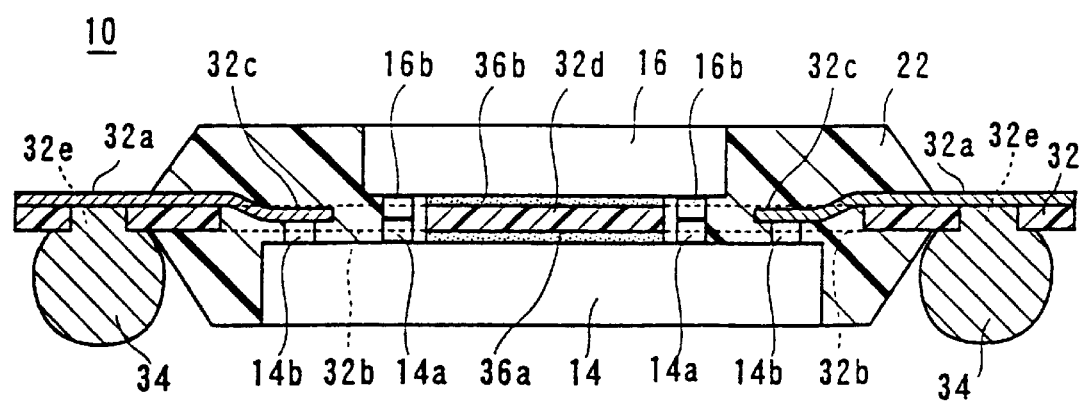
FIG. 36 is an illustrative view showing still another embodiment of this invention.
Figure 37:
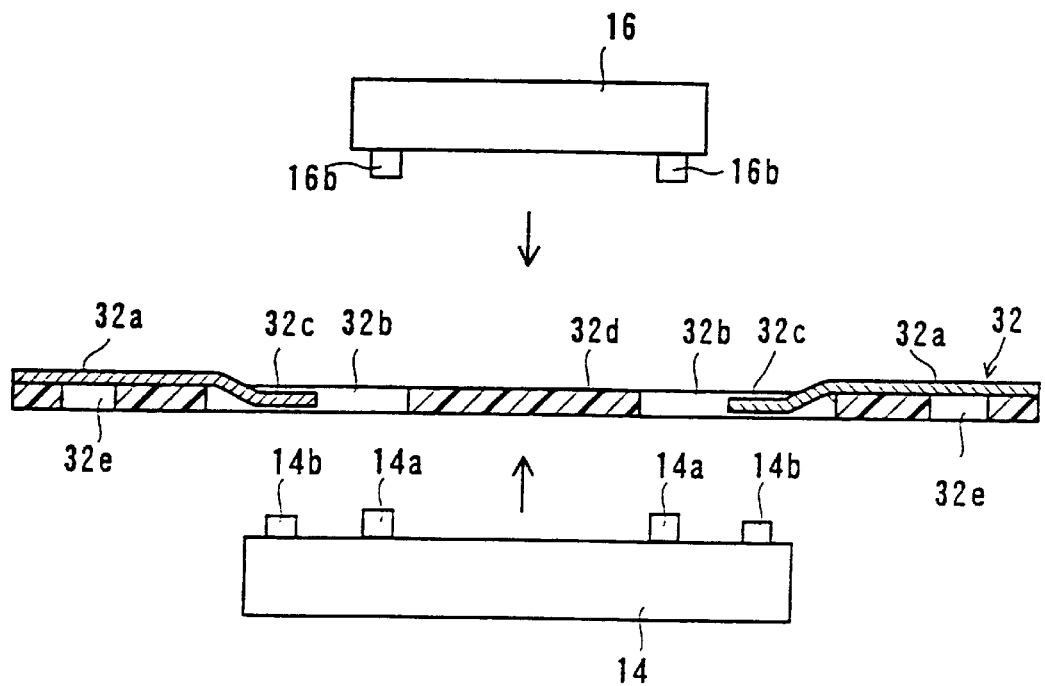
FIG. 37 is an illustrative view showing one part of a structure of the FIG. 36 embodiment.
Figure 38:
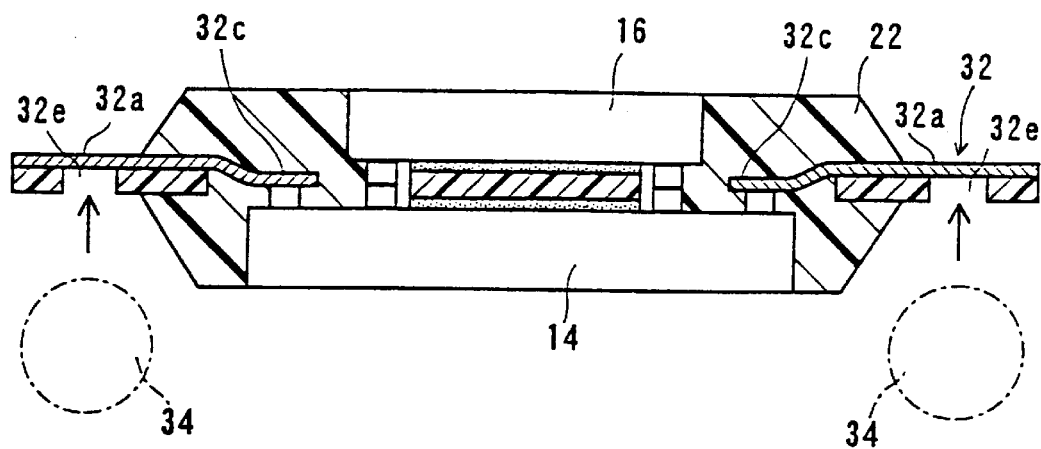
FIG. 38 is an illustrative view showing another part of the structure of the FIG. 36 embodiment.

FIG. 36 is a sectional view showing a resin-packaged semiconductor device 10 according to another embodiment. FIGS. 37 and 38 are essential-part sectional views showing a manufacturing process for the resin-packaged semiconductor device 10 shown in FIG. 36.

The resin-packaged semiconductor device 10 shown in FIG. 36 comprises a first semiconductor chip 14, a second semiconductor chip 16, a base plate 32 in a film form, a package resin 22, and external terminals 34. These first semiconductor chip 14 and the second semiconductor chip 16 are common in basic structure to the first semiconductor chip 14 and second semiconductor chip 16 of the FIG. 33 embodiment, omitting detailed explanations.

The base plate 32 is based on a synthetic-resin film formed flexible and thin, for example, of polyimide, and provided at its upper surface with conductive wiring 32a formed by etching a copper foil. This base plate 32 is formed with two opening holes 32b, 32b penetrating therethrough in a thickness direction. The opening holes 32b, 32b respectively have cantilever terminals 32c, 32c connected thereto.

The first semiconductor chip 14 is adhered through an adhesive layer 36a to the base plate 32 at its center area 32d located between the two opening holes 32b, 32b, with the active surface directed upward. The bumps 14a and the electrode pads 14b on the first semiconductor chip 14 are positioned at inside or beneath the opening hole 32b not to be covered over by the base plate 32. The electrode pads 14b are respectively connected to the terminals 32c. The second semiconductor chip 16 is adhered through an adhesive layer 36b onto the center area 32d of the base plate 32, with the active surface directed downward. The first semiconductor chip 14 and the second semiconductor chip 16 are faced at their active surfaces to each other, and the bumps 14a on the first semiconductor chip 14 and the bumps 16b of the second semiconductor chip 16 are oppositely contacted and hence electrically connected with each other.

The package resin 22 is formed to cover around the first semiconductor chip 14 and the second semiconductor chip 16, and has stop and back surfaces respectively flush with an upwardly-directed passive surface of the second semiconductor chip 16 and a downwardly-directed passive surface of the first semiconductor chip 14. This allows the respective passive surfaces of the two semiconductor chips 14, 16 to be exposed outside of the package resin 22.

The external terminal 34 is a ball-formed solder terminal, which at its upper end is connected to the conductive wiring 32a through the hole 32e opened through the base plate 32. This external terminal 34, if heated and melted, enables the resin-packaged semiconductor device 10 to be surface-mounted onto a desired location.

The resin-packaged semiconductor device 10 is manufactured through a manufacturing process as stated below. That is, as shown in FIG. 37, the first semiconductor chip 14 and the second semiconductor chip 16 are respectively adhered to center area 32d opposite surfaces of the elongate base plate 32, with their electrode pads 14b as well as bumps 14a and 16b electrically connected in a predetermined manner. Then, a resin packaging operation is performed using a package resin 22 to encapsulate predetermined portions, as shown in FIG. 38. Thereafter, the solder balls 34 are bonded to the respective underside openings of the holes 32e of the base plate 32, and melted by heating and then hardened again. The solder ball 34, when melted, partly flows into the hole 32e, thereby being electrically connected to the conductive wiring 32a. The molten solder ball 34, when hardened, is set again in a ball form due to its surface tension. Thus, the solder ball 34 is appropriately formed into an external terminal. After forming the external terminals 34 as above, the elongate base plate 32 may be cut.

In the resin-packaged semiconductor device 10 shown in FIG. 38, the respective passive surfaces of the first semiconductor chip 14 and the second semiconductor chip 16 are exposed outside of the package resin 22. This, therefore, allows the heat generated by the two semiconductor chips 14, 16 to be dissipated outside with efficiency, thus enhancing the ability of heat radiation. This structured is convenient to reduce the weight and total thickness, because no heat sink is used and the number of parts is reduced. Further, this resin-packaged semiconductor device 10 does not use conductor wires to electrically connect between the two semiconductor chips 14, 16, the electrical connection is easy to perform. Further, the semiconductor chips 14, 16 are mounted on a film-formed base plate 32 less expensive to manufacture instead of using a comparatively expensive leadframe, giving an advantage to reduce the total manufacture cost.

In this manner, the resin-packaged semiconductor device 10 in this embodiment does not necessarily require to use a leadframe, and may be structured utilizing a film-formed base plate or a base plate different in form therefrom, instead of using a leadframe. Further, in the above embodiments heat radiating function is provided by utilizing a heat sink 30 for the first semiconductor chip 14, 16 or exposing the passive surface to the outside. However, this invention is not limited to such structures. That is, where a heat radiating function is given by exposing the passive surface of the second semiconductor chip 16 to the outside, the first semiconductor chip 14 may be entirely covered, for example, by a package resin. Also, in this embodiment, it is possible to provide a heat radiating function to the respective passive surfaces of the two semiconductor chips 14 and 16 by arranging the first semiconductor chip 14 and the second semiconductor chip 16 with their active surfaces faced to each other. However, it is a matter of appropriate selection to determine as to whether the heat radiating function is provided to both the first semiconductor chip 14 and the second semiconductor chip 16 or not. In brief, it is satisfactory in this invention that at least one of the passive surfaces of the fist semiconductor chip 14 and the second semiconductor chip 16 is exposed outside of the package resin.

Figure 39:
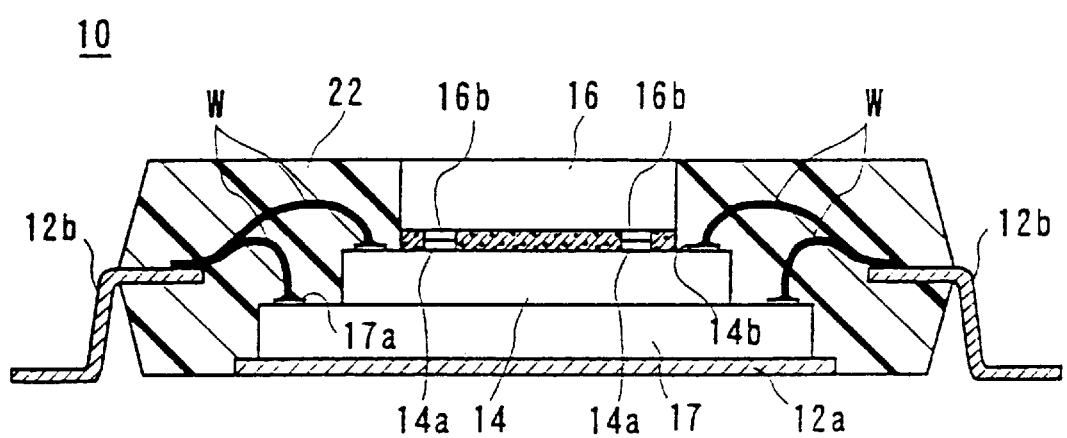
FIG. 39 is an illustrative view showing one part of a structure according to another embodiment of this invention.

FIG. 39 is an essential-part sectional view showing a resin-packaged semiconductor device 10 according to yet another embodiment. In the same figure, the same parts to those of the resin-packaged semiconductor device 10 shown in FIG. 33 are denoted by the same reference numerals, omitting the explanations thereof.

This resin-packaged semiconductor device 10 includes a first semiconductor chip 14 or a second semiconductor chip 16 with its passive surface adhered to an upper surface of the die pad 12*a*. The first semiconductor 14 and the second semiconductor chip 16 are adhered with their active surfaces faced to each other wherein a downwardly-directed passive surface of the first semiconductor chip 14 is adhered to an active surface of a third semiconductor chip 17. The third semiconductor chip has electrode pads 17*a* and the first semiconductor chip 14 has pad electrodes 14*b*, which electrodes are wire-bonded through wires W to respective lead terminal 12*b*. The package resin 22 has a top surface in flush with the upwardly-directed passive surface of the second semiconductor chip 16 so that this passive surface is exposed outside of the package resin 22. Also, the package resin 22 has a back surface in flush with an underside of the die pad 12*a* so that this die pad 12*a* is exposed outside of the package resin 22.

As can be understood from the structure of this resin-packaged semiconductor device 10, in this embodiment another semiconductor chip 17 may be provided by stacking in addition to the two stacked semiconductor chips 14, 16 on each other. In one form of adding another semiconductor chip 17, the semiconductor chip 17 may be arranged at a position facing to the passive surface of the first semiconductor chip 14, as in this resin-packaged semiconductor device 10. In such a case, it is possible to expose the passive surface of the second semiconductor chip 16 to the outside of the package resin 22. In a different form to this, another semiconductor chip may be sandwiched between the first semiconductor chip 14 and the second semiconductor chip 16 at their opposite passive surfaces. This structure would be easily understood by considering, where the respective semiconductor chips 16, 17 in the FIG. 39 structure are respectively considered as a first semiconductor chip and a second semiconductor chip placed facing at their passive surfaces to each other, a third semiconductor chip be considered interposed between these two semiconductor chips 16 and 17. Also, in this invention a plurality of semiconductor chips may be added to the first semiconductor chip 14 and the second semiconductor chip 16 so that the number of the semiconductor chips stacked in a thickness direction is three or four or more.

In addition, the resin-packaged semiconductor device according to this invention is not limited as to concrete structure for various parts, and can be modified in design in various ways. Naturally, this invention is applicable to various semiconductor chips involving, for example, various memory devices such as ferroelectric memories (ferroelectric RAM) and other various IC chips and LSI chips, regardless of concrete kind of semiconductor chips.

Figure 40:
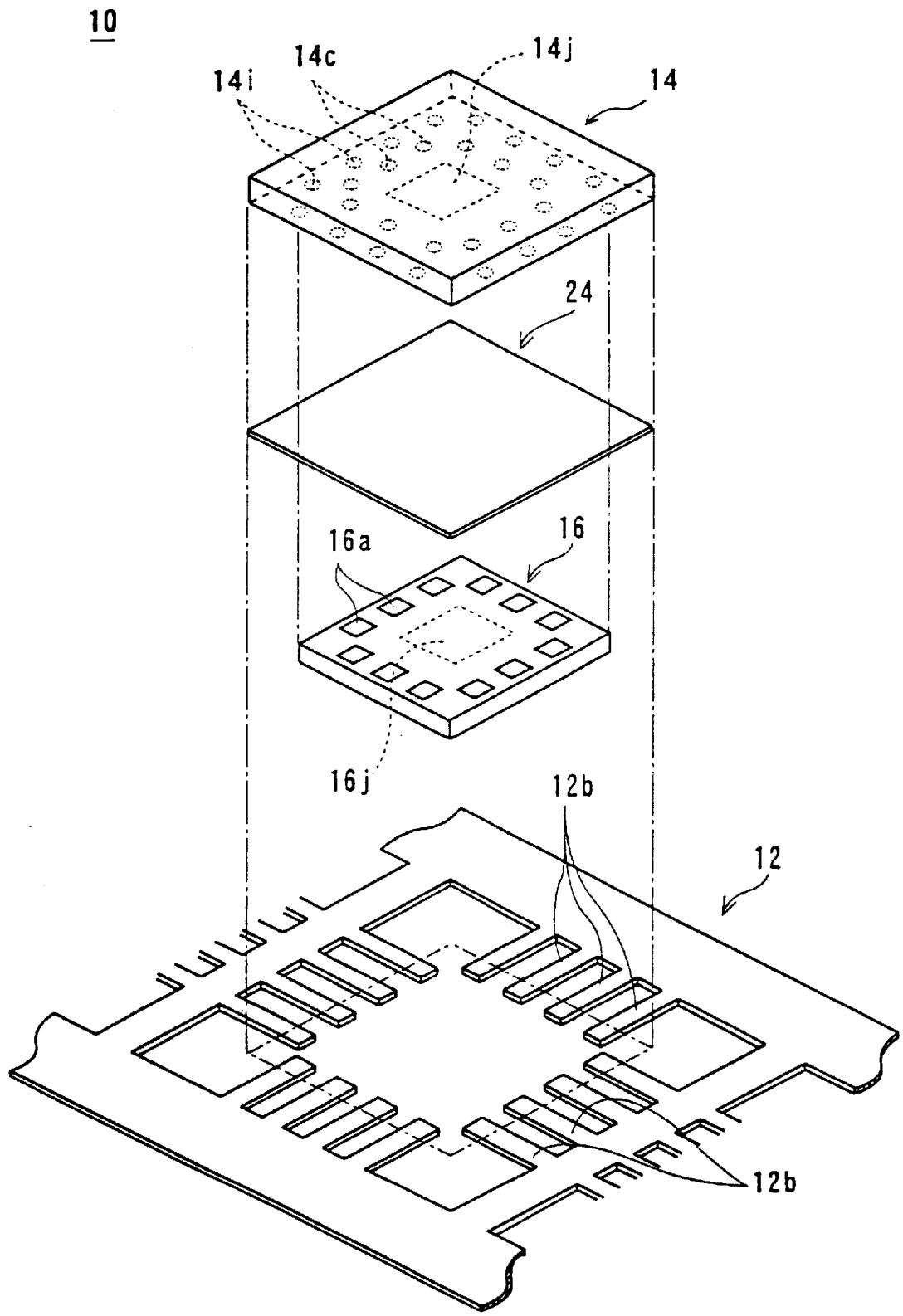
FIG. 40 is an illustrative view showing another embodiment of this invention.

Referring to FIG. 40, a semiconductor device 10 according to another embodiment, different from the embodiment of FIG. 1 to FIG. 6, comprises bumps 14*i* on electrode pads 14*b* of an IC main chip 14, and an anisotropic conductive film 24 having a size of that of the IC main chip 14 and adhered to the same surface, wherein the bumps 14*i* are connected through the conductive film 24 to lead terminals 12*b*. The base plate 12*a* is omitted from the leadframe 12. This structure is the same as the embodiment of FIG. 1 to FIG. 6 in that the IC sub-chip 16 is mounted on the IC main chip 14.

Since the lead terminals 12*b* are directly connected to the IC main chip 14 in this manner, there is no necessity of providing a margin, for wire bonding, between the peripheral edge of the IC main chip 14 and the lead terminals. This contributes to reduction in width and length of a package body encapsulating the both chips 12, 14, and ultimately the width and length of the semiconductor device 10.

Figure 41:
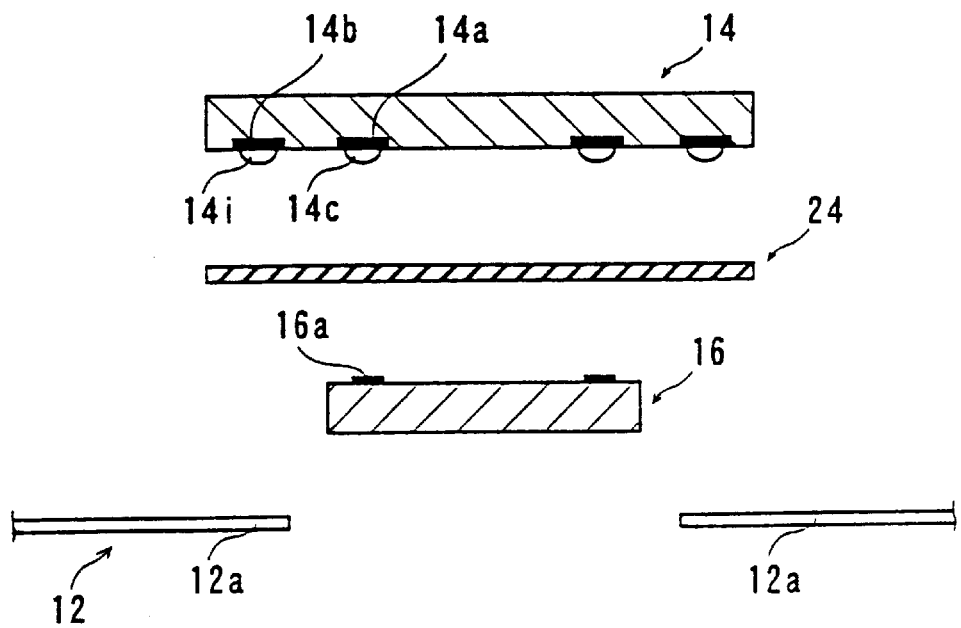
FIG. 41 is an illustrative view showing one part of a structure of the FIG. 41 embodiment.
Figure 42:
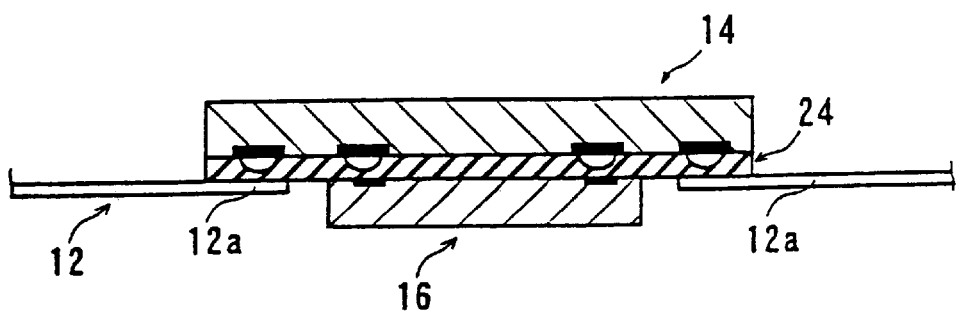
FIG. 42 is an illustrative view showing another part of a structure of the FIG. 41 embodiment.

As will be understood from FIG. 41 and FIG. 42, it is possible to simultaneously perform the mounting of the IC sub-chip 16 onto the IC main chip 14 and the fixing the IC main chip 14 to the lead terminals 12*b*. Further, the wire bonding process conventionally required can be omitted. Therefore, the manufacture process is simplified and the unacceptable-good occurring rate and hence manufacture cost is greatly reduced.

Incidentally, although in this embodiment the bumps 14*c*, 14*i* were provided on the IC main chip 14, the bumps 14*c* may be provided on the IC sub-chip 16 and the bumps 14*i* be on the lead terminals 12*a*. Alternatively, the bumps 14*i* may be omitted so that the conductive film 24 is partially compressed and deformed by the lead terminals 12*a*. Further, recessed bumps may be provided on the IC sub-chip 16 and the lead terminals 12*a*, similarly to the embodiment of FIG. 11 to FIG. 13. Alternatively, a plurality of IC sub-chips 16 may be mounted on the IC main chip 14.

Figure 43:
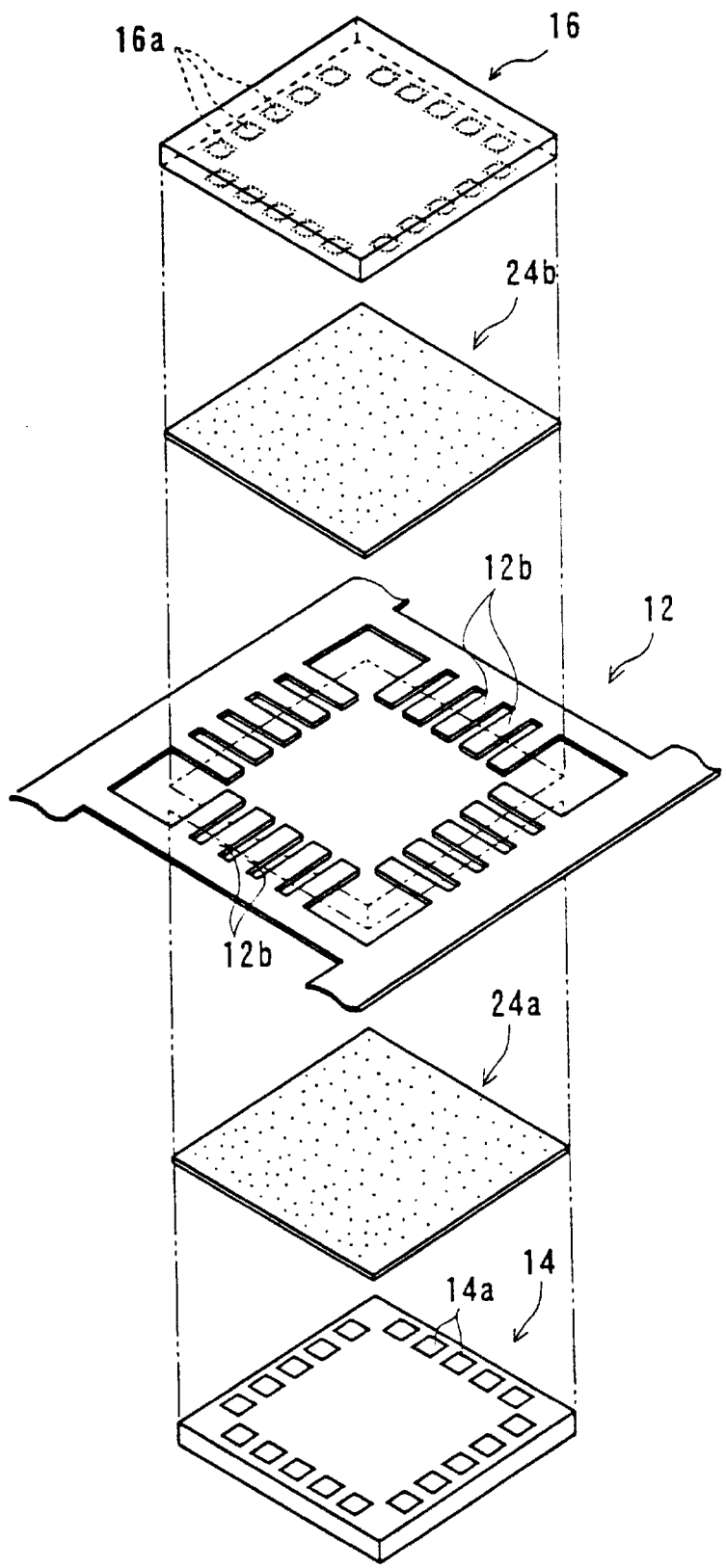
FIG. 43 is an illustrative view showing another embodiment of this invention.

Referring to FIG. 43, a semiconductor device 10 according to another embodiment is different from the embodiment of the FIG. 1. That is, the IC main chip 14 is the same in size as the IC sub-chip 16, and has a surface formed with only electrode pads 14*a*. The IC main chip 14 is arranged at an underside of a leadframe 12, while the IC sub-chip 16 is placed on the leadframe 12. The leadframe 12 has a plurality of lead terminals inwardly projecting so that the lead terminals 12*b* have respective tip positioned opposite to the electrode pads 14*a* and 16*a* provided on the IC main chip 14 and IC sub-chip 16. Anisotropic conductive films 24*a* and 24b are respectively placed on lower and upper surfaces of the leadframe 12.

Figure 44:
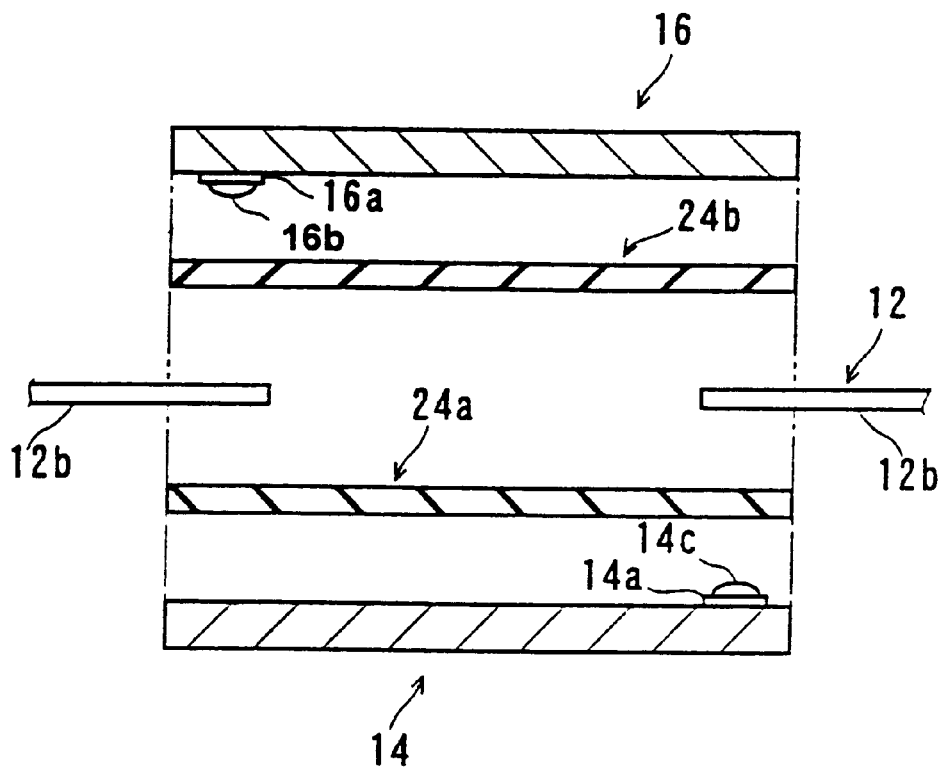
FIG. 44 is an illustrative view showing one part of a structure of the FIG. 43 embodiment.
Figure 45:
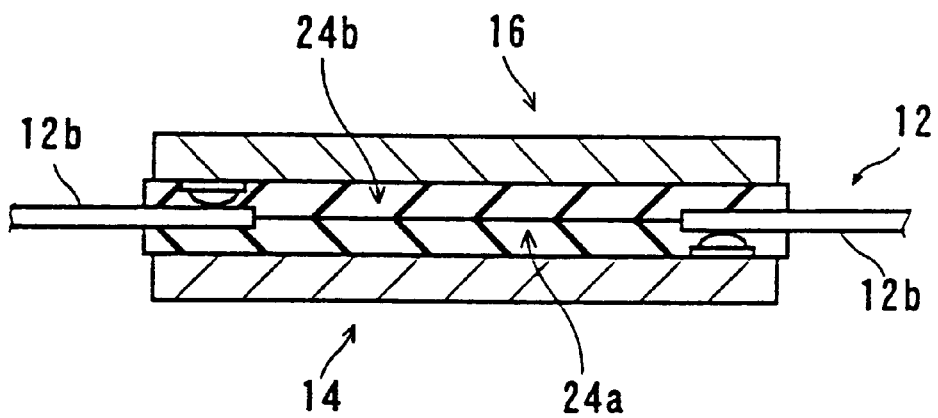
FIG. 45 is an illustrative view showing another part of the structure of the FIG. 43 embodiment.

As shown in FIG. 44, each electrode pad 14a is provided with a bump 14c, while each electrode pad 16a has a bump 16b. Consequently, if the IC main chip 14 is depressed against the back surface of the leadframe 12 and the IC sub-chip 16 is placed against the upper surface of the leadframe 12, then the bumps 14c and 16b are brought into electrical connection to the respective lead terminals 12b through the conductive films 24a and 24b.

Figure 46:
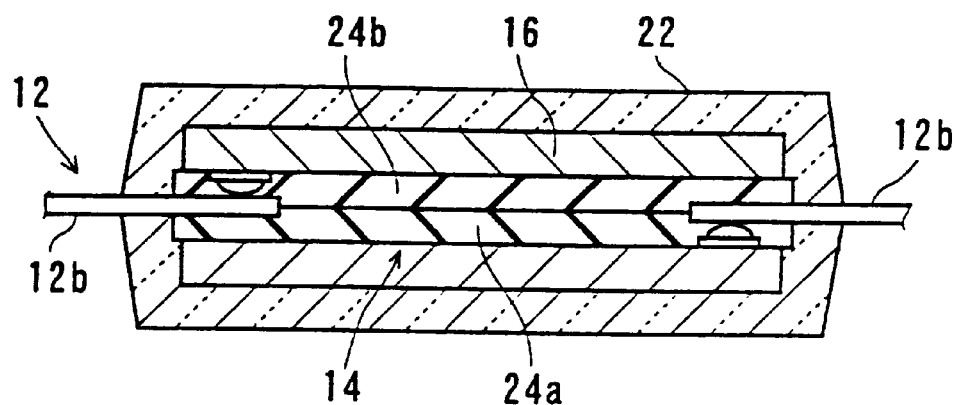
FIG. 46 is an illustrative view showing still another part of the structure of the FIG. 43 embodiment.
Figure 47:
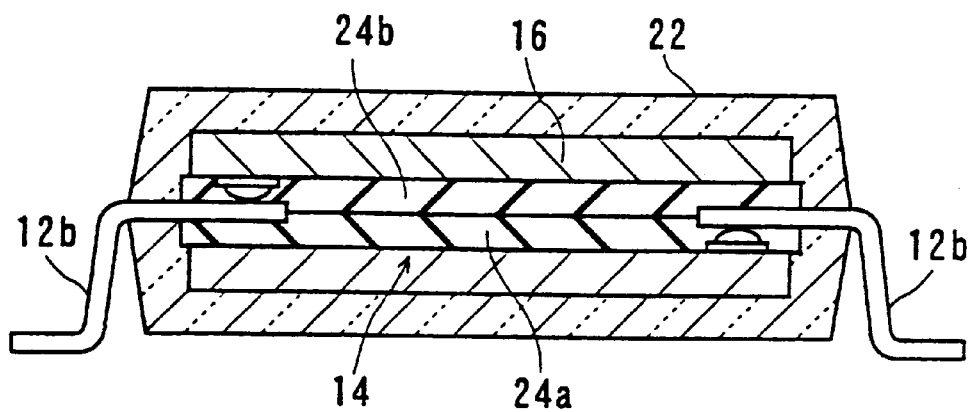
FIG. 47 is an illustrative view showing yet another part of the structure of the FIG. 43 embodiment.

After the both IC chips 14 and 16 are fixed to the leadframe 12 in this manner, a synthetic-resin package 22 is transfer-molded to encapsulate entirely the IC chips 14 and 16, as shown in FIG. 46. Then, the lead terminals 12b are cut out of the leadframe 12 and bent at portions projecting from side surfaces of the package 22 into a form generally in flush with the underside of the package 22, thus completing a semiconductor device 10.

According to this embodiment, the lead terminals 12b are sandwiched between the two IC chips 14 and 16, there is no necessity of providing a wire-bonding margin between the peripheral edge of the IC chip 14, 16 and the lead terminals 12b. Furthermore, the wire bonding process is unnecessary to perform.

Incidentally, although in this embodiment the bumps 14c and 14b were respectively provided on the IC chips 14 and 16, the bumps may be provided on the lead terminals 12b. Also, the bumps 14c and 16b may be omitted and the conductive films 24a and 24b be partially compressed and deformed only by the lead terminals 12b.

Figure 48:
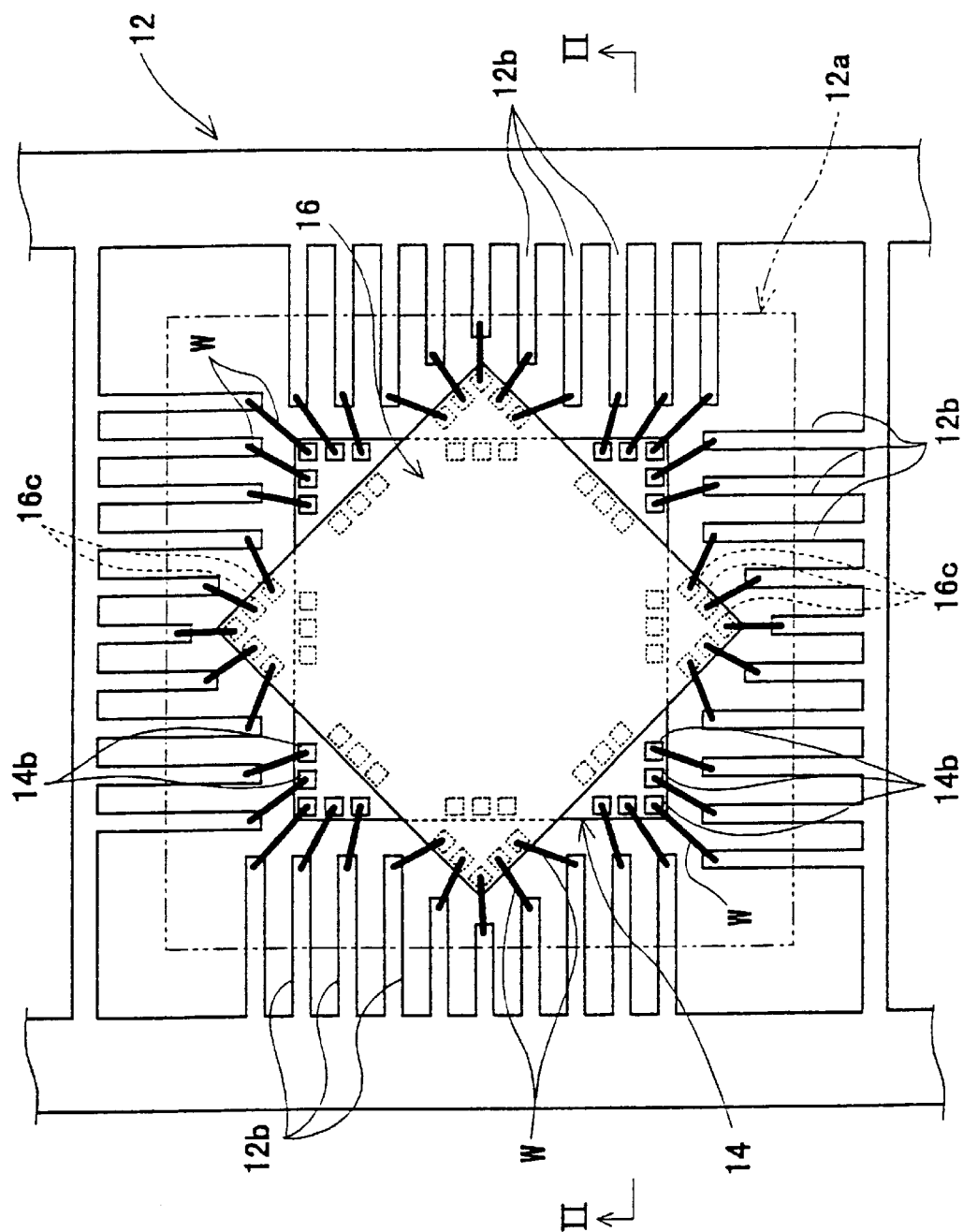
FIG. 48 is an illustrative view showing another embodiment of this invention.

Referring to FIG. 48, a semiconductor device 10 according to yet another embodiment includes a leadframe 12. This leadframe 12 is formed with a base plate 12a on which the IC main chip 14 is mounted. On the IC main chip 14 is further mounted an IC sub-chip 16 with their surfaces facing to each other. The IC main chip 14 and IC sub-chip 16 are generally in a square form as viewed in plan, and the same in size.

The IC main chip 14 is formed, at four corners on the surface, with electrode pads 14b to be connected to the lead terminals 12b, while the IC sub-chip 16 is also formed, at four corners on the surface, with electrode pads 16c to be connected to the lead terminals 12b. When mounting the IC sub-chip 16 on the IC main chip 14, the IC sub-chip 16 is positioned rotated by 45 degrees relative to the IC main chip 14. This allows the electrode pads 14b and 16c to be exposed outside. The electrode pads 14b and 16c are respectively bonded to the lead terminals 12b through wires W. Incidentally, the electrode pads 14a (not shown) on the IC main chip 14 and the electrode pads 16a on the IC sub-chip 16 are connected to each other through bumps 16b.

Figure 49:
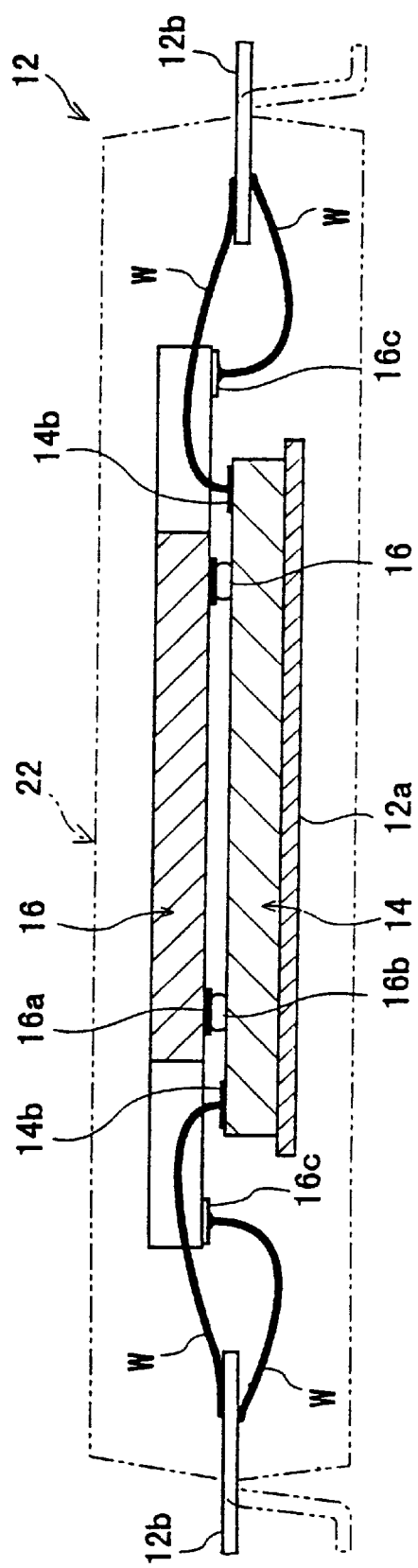
FIG. 49 is an illustrative view showing one part of a structure of the FIG. 48 embodiment.

Thereafter, as shown by two-dot chain lines in FIG. 49, encapsulation is made by a synthetic resin package 22 and the lead terminals 12b are cut away from the leadframe 12 and bent, thus completing a semiconductor device 10.

According to this embodiment, since the IC sub-chip 16 is mounted such that the IC main chip 14 and the IC sub-chip 16 are deviated at their four corners from each other, it is possible to determine the size of the IC sub-chip 16 same as the IC main chip 14. Thus, the IC sub-chip 16 is increased in integration density.

Incidentally, in this embodiment the electrode pads 14b and 16c were connected to the lead terminals 12b through wire-bonding. However, metal-foiled lead terminals are formed on a surface of a synthetic-resin flexible film, and the lead terminals are directly connected to bump-formed electrode pads 14b and 16c. Alternatively, an anisotropic conductive film may be interposed between the IC main chip 14 and the IC sub-chip 16. With this structure, the conductive film is depressed by the bumps 16b, thereby providing positive electrical connection between the electrode pads 14a and 16a.

Using FIG. 50 to FIG. 57, explanations will be made in detail for a process for mounting a second semiconductor chip (IC sub-chip) 16 on a first semiconductor chip (IC main chip) 14. The first semiconductor 14 and the second semiconductor 16 are configured, for example, as LSI chips or other IC chips, any of which has desired electronic circuits (circuit elements) integrally fabricated on the silicon chip. The first semiconductor chip 14 is formed at its surface with bumps 14c in a projection form and electrode pads 14b in a rather flattened form. On the other hand, the second semiconductor chip 16 is formed at its surface with a plurality of bumps 16b in a projection form, corresponding to the bumps 14c on the first semiconductor chip 14. It is noted that FIG. 50 depicts a state that the second semiconductor chip 16 is held by a suction collet 40 of a chip bonding apparatus.

The bumps 14c, 16b are preferably formed as gold-made bumps in order to enhance electrical connectability. Similarly, the electrode pads 14b are also preferably formed of gold at least on their surface, in order to enhance electrical connectability with conductor wires such as gold wires. Such electrode can be formed, for example, by subjecting gold plating over aluminum flattened electrode main body formed on the first semiconductor chip 14.

The first semiconductor chip 14 is held on a carrier tape 42 with its surface directed upward and its backside adhered to the carrier tape 42. This carrier tape 42 is formed in an elongated form and has a multiplicity of first semiconductor chips 14 adhered to its surface at a given pitch interval. The transfer of this carrier tape 42 enables the first semiconductor chips 14, one by one, to be positioned to a predetermined location.

Figure 50:
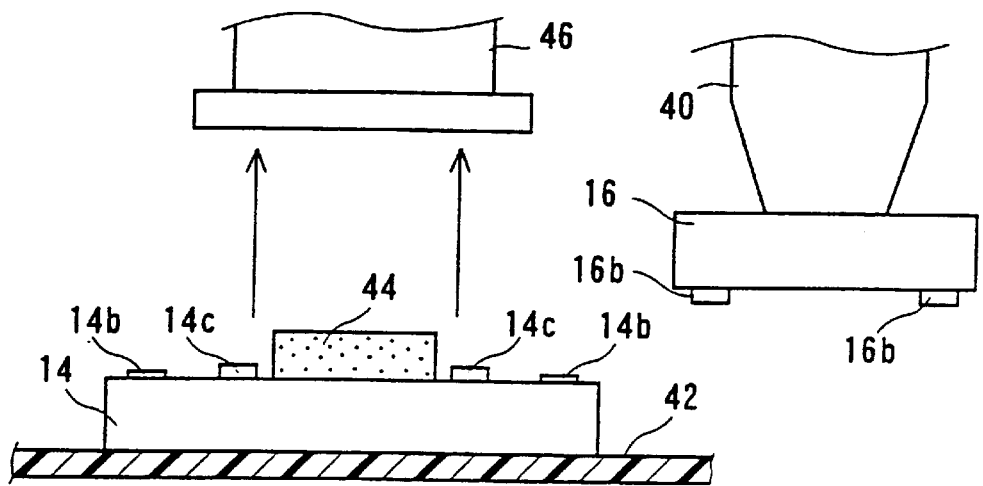
FIG. 50 is an illustrative view showing one part according to another embodiment of this invention.

To manufacture a desired stacked chip structure in this embodiment, an anisotropic conductive adhesive 44 is first applied to a surface of the first semiconductor chip 14, as shown in FIG. 50. This anisotropic conductive adhesive 44 is, for example, a thermo-setting epoxy resin containing conductive particles such as metal particles dispersed therein. This anisotropic conductive adhesive 44, if merely applied to the surface of the first semiconductor chip 14, does not exhibit electrical conductivity in a thickness direction. However, if it is exerted by a pressure with a predetermined value or greater in the thickness direction, the region applied by the pressure exhibits electrical conductivity in the thickness direction. The anisotropic conductive adhesive 44 is not applied over the entire surface of the first semiconductor chip 14, but to an area inside the plurality of bumps 14c so as to prevent the bumps 14c form being covered over by the anisotropic conductive adhesive. The thickness of the anisotropic conductive adhesive 44 applied is a little higher than a height of the bumps 14c.

Then, the surface of the first semiconductor chip 14 is imerged by an imager camera 46 such as a CCD camera positioned above the same chip. This imager camera 46 is connected with a determination circuit (not shown) that recognizes image data of a plurality of bumps 14c among the image data obtained by imaging with this imager camera 46 and determines their positions. This determining circuit determines the position of each bump 14c. As stated before, since the bumps 14c are in a state of not covered by the anisotropic conductive adhesive 44, these bumps 14c can be clearly imaged by the imager camera 46, thus determining their positions.

Figure 51:
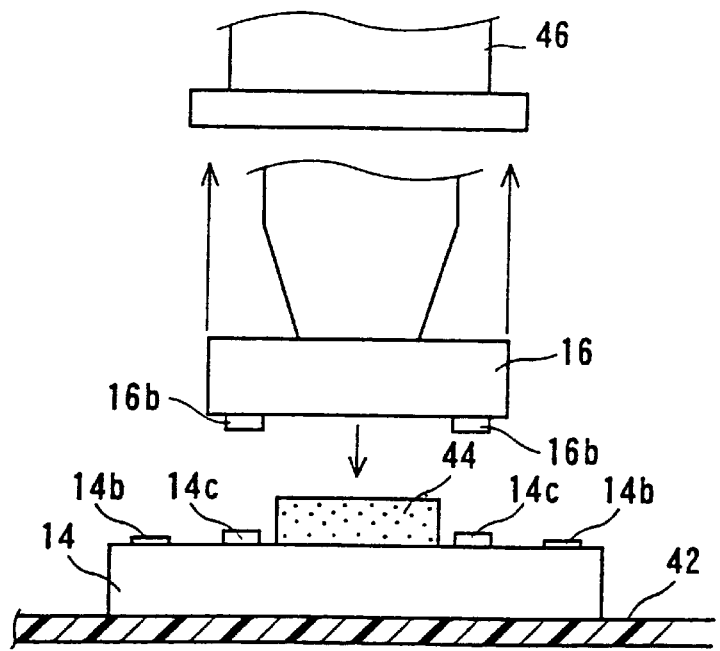
FIG. 51 is an illustrative view showing another part of the FIG. 50 embodiment.

After performing the imaging operation on the first semiconductor chip 14, a second semiconductor chip 16 held by a suction collet 40 is positioned to a location above the first semiconductor chip 14, as shown in FIG. 51. Then, the second semiconductor chip 16 at its backside is imaged by the imager camera 46. This back surface is contacted by a tip portion of the suction collet 40 and difficult to be imaged over the entire surface. However, it is possible to image peripheral edge portions constituting contour lines on the backside. The suction collet 40 is preferably structured not to be upwardly bulky. If so structured, the imager camera 46 can be accessed to an top surface of the second semiconductor chip. After imaging the backside of the second semiconductor chip 16 by using the imager camera 46, the four corners of the backside outline are recognized by the determining circuit of this imager camera 46 and the respective positions of the bumps 16b are determined based on this data. That is, the four corners in outline of the second semiconductor chip 16 and the bumps 16b are provided in a given positional relationship previously determined. Accordingly, if the four corners are revealed in position, the positions of the bumps 16b can be determined by calculation based thereon.

Since the semiconductor chip is imaged at its backside in this manner, it is possible to image the both semiconductor chips without shifting the direction of the imager camera 46.

After determining the positions of the bumps 16b, the suction collet 40 is finely controlled of horizontal position such that these bumps 16b are aligned with respect to the bumps 14c of the first semiconductor chip 14. Alternatively, the first semiconductor chip 14 is finely controlled of horizontal position. Thereafter, the suction collet 40 is descended to rest the second semiconductor chip 16 on the first semiconductor chip 14, and depress the second semiconductor chip 16 downward. The bumps 14c of the first semiconductor chip 14 and the bump 16b of the second semiconductor chip 16 are aligned beforehand based on the data obtained through the imaging operation as stated above. Consequently, these bumps 14c and 16b can be faced to each other with accuracy.

Also, if the second semiconductor chip 16 is depressed downward, the anisotropic conductive adhesive 44 is compressed between the two semiconductor chips 14, 16 and spread in horizontal directions. Due to this, the anisotropic conductive adhesive 44 advances between the bumps 14c, 16b, and spreads further to an outer area of the bump 14c, 16b forming positions. This makes it possible to cover almost the entire surface of the second semiconductor chip 16. Thus, the first semiconductor chip 14 and the second semiconductor chip 16 can be adhered to each other in a state that the semiconductor chips 14, 16 at their surfaces are resin-encapsulated by the anisotropic conductive adhesive 44 with broad area.

Figure 53:
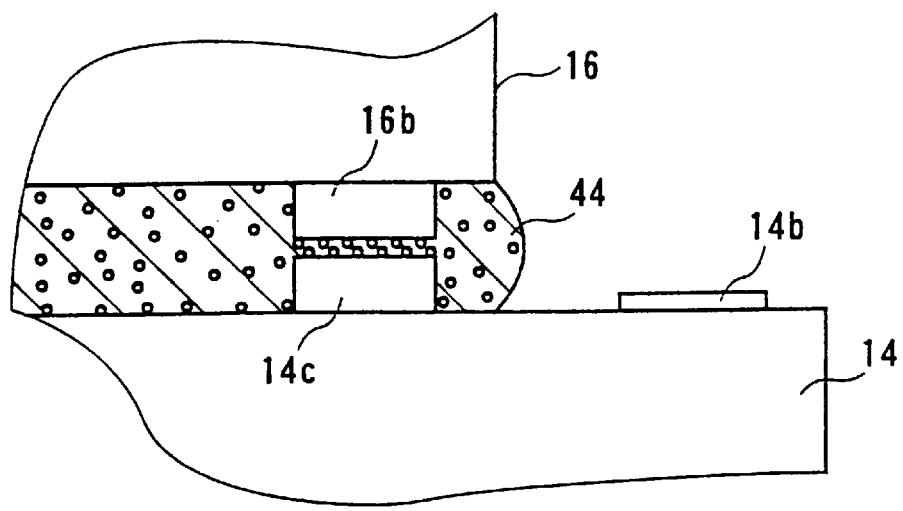
FIG. 53 is a magnification view showing one part of the FIG. 50 embodiment.

The anisotropic conductive adhesive 44 undergoes large compressive forces at between the opposite bumps 14c, 16b. Due to this, the conductive particles disperse within the anisotropic conductive adhesive 44 exist in a high density between these bumps 14c, 16b as shown in FIG. 53. These conductive particles are adhered to the surfaces of the bumps 14c, 16b, providing appropriate electrical connection only between the bumps 14c, 16b.

After completion of the work, the anisotropic conductive adhesive 44 is heated and cured. This ensures the adhesion between the first semiconductor chip 14 and the second semiconductor chip 16 with higher reliability. The thermoset anisotropic conductive adhesive 44 also appropriately serves as an encapsulating resin to protect the respective surfaces of the two semiconductor chips 14, 16.

Figure 54:
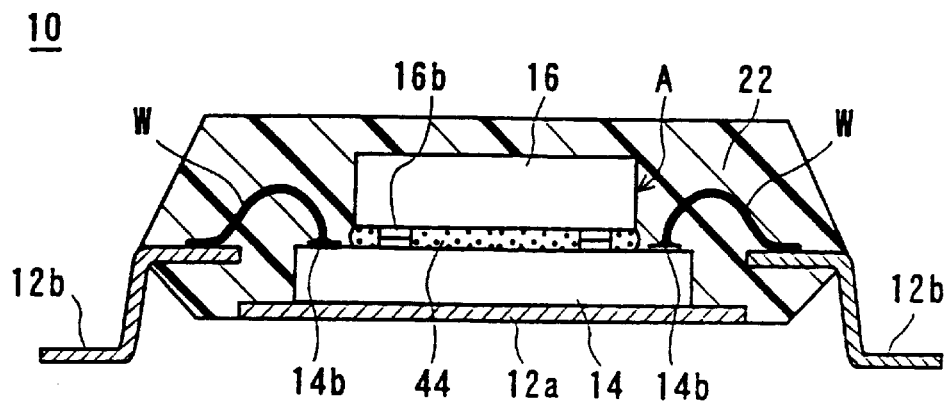
FIG. 54 is an illustrative view showing one part of a structure of the FIG. 50 embodiment.

As shown in FIG. 54, the stacked-chip structure A manufactured by the above series of operating processes is utilized, for example, to manufacture a resin-packaged semiconductor device 10. This semiconductor device 10 is structured by mounting he stacked-chip structure A on a die pad (base plate) 12a of a leadframe 12, and a plurality of electrode pads 14b of the first semiconductor chip 14 are connected through wires W to lead terminals 12b of the leadframe 12, wherein the stacked-chip structure A and its peripheral portions are covered by a package resin 22 such as of an epoxy resin. This package resin 22 has the lead terminals 12b outwardly projected therefrom.

The semiconductor device 10 can be surface-mounted onto a desired location such as on a circuit board surface by the utilization of the lead terminals 12b. Naturally, the semiconductor device 10 includes the two semiconductor chips 14, 16 stacked in a vertical or thickness direction, and is convenient for high-density mounting of semiconductor chips. As already stated, since the respective bumps 14c, 16b of the two semiconductor chips 14, 16 are electrically connected with accurately positioned, the resulting semiconductor device is of high quality with less suffering from poor electrical connection between the electrodes. Further, since the two semiconductor chips 14, 16 are electrically connected through the bumps 14c, 16b with each other, it is satisfactory during manufacturing a semiconductor device 10 to electrically connect only the first semiconductor chip 14 to the lead terminals 12b without necessity of connection of the second semiconductor chip 16 to the lead terminals 12b. Thus, an advantage that the manufacturing process is simplified for the semiconductor device 10 obtained.

Figure 55:
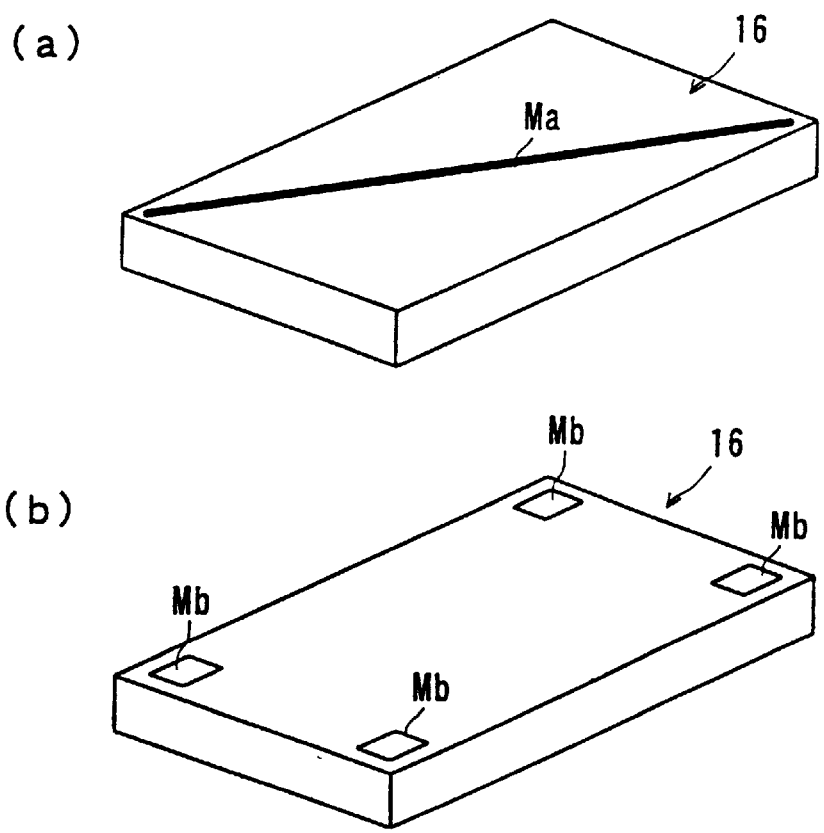
FIG. 55 is an illustrative view showing one part according to a still another embodiment of this invention.

Incidentally, in this embodiment the second semiconductor chip 16 was imaged at its backside to recognize positions of outlined corners thereof in the operation process shown in FIG. 51, and based on which data the positions of the bumps 16b were determined. However, this invention is not limited to this. In this invention, it is possible to previously provide an optically readable appropriate mark on the backside of the semiconductor chip 16 so that the position of an electrode on the surface of the semiconductor chip 16 is determined from the position of the mark read out. Such a mark applicable involve, for example, a mark Ma diagonally provided connecting between corners on the backside of the semiconductor chip 16 as shown in FIG. 55(*a*), or marks Mb generally in a rectangular form in plan provided at or adjacent corners on the backside of the semiconductor chip 16 as shown in the same FIG. (b).

Figure 56:
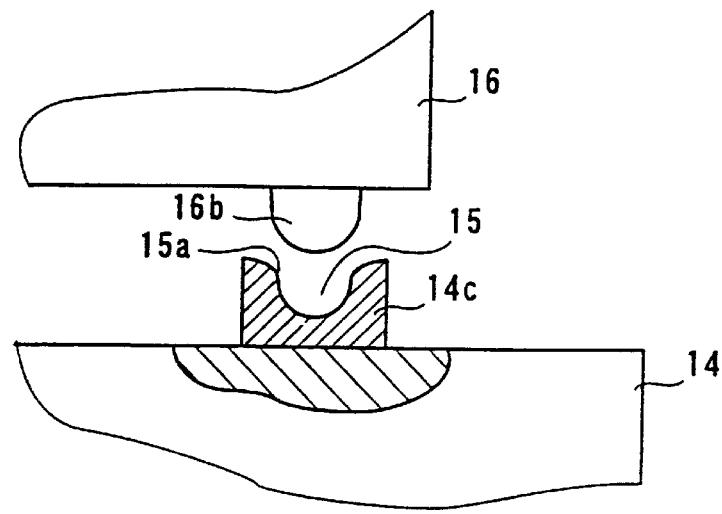
FIG. 56 is an illustrative view showing one part according to another embodiment of this invention.

In this invention, where the respective bumps 14c, 16b of the two semiconductor chips 14, 16 are formed as projecting electrode having a certain height as shown in FIG. 56, the bump 14c may be formed with a concave portion 15 at a tip thereof so that a convex tip portion of another bump 16b is received in this concave portion 15. This concave portion 15 is formed, for example, as a bawl-formed concave and has an inner wall 15a formed as a taper surface to allow the tape of the bump 16b to be guided to a center of the bump 14. If such a means is adopted, when the two bumps 14c, 16b are brought into contact with each other, the bump 14c is guided to a center of the bump 16b by contacting a tip of the one bump 14c with the inner wall 15a of the recess 15 regardless of previous and somewhat positional deviation between these bumps 14c, 16b. Thus, the bumps 14c, 16b are aligned in position more positively.

Figure 57:
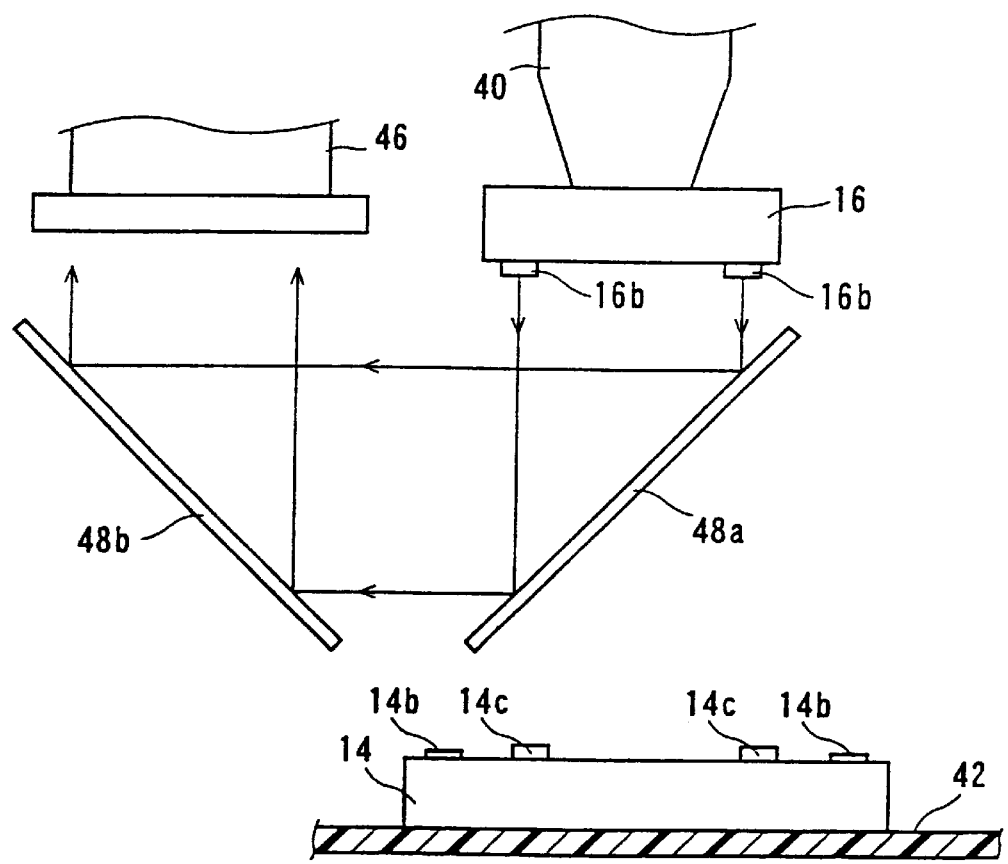
FIG. 57 is an illustrative view showing one part according to still another embodiment of this invention.

Further, in this embodiment, where a second semiconductor chip 16 is placed on a first semiconductor chip 14, it is possible as shown in FIG. 57 to place an imaging camera 46 on a side of a suction collet 40 and further place mirrors 48a, 48b respectively below the second semiconductor chip 16 and the imaging camera 46 so that the second semiconductor chip 16 at its surface is imaged by the imaging camera 46. The mirrors 48a, 48b may be movably provided so that they are positioned downward of the surface only when the surface of the second semiconductor chip 16 is imaged. If adopting such a means, a plurality of bumps 16b on the second semiconductor chip 14 can be imaged by the imaging camera 46, enabling more accurate grasping of their positions.

According to these embodiments, the means for determining positions of the first and second semiconductor chip electrodes requires only one imaging camera, without requiring two imaging cameras. Therefore, this correspondingly reduces the cost for stacked-chip manufacturing facilities. This can, in turn, reduce the manufacturing cost of the stacked chips.

Figure 52:
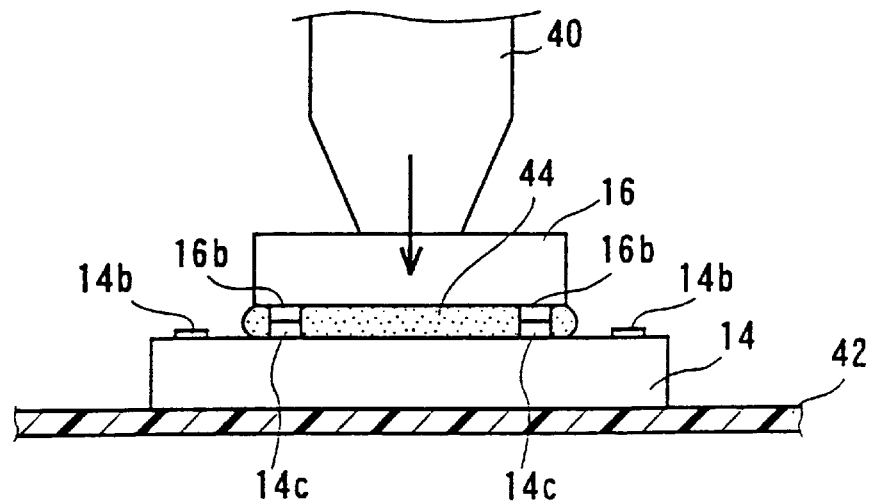
FIG. 52 is an illustrative view showing still another part of the FIG. 50 embodiment.

FIG. 50 to FIG. 52 are side views showing one example of a series of operating processes of a method for manufacturing stacked chips according to this invention. FIG. 53 is an essential-part sectional view partly magnified of FIG. 52. Besides, the detailed operating processes for manufacturing stacked chips according to this invention is not limited to the embodiments stated as above, and can be modified in various ways. For example, another semiconductor chip may be added to the first semiconductor chip 14 and the second semiconductor chip 16 so that it is adhered to the first semiconductor chip 14 or second semiconductor chip 16. Also, the means for adhering the first semiconductor chip 14 and the second semiconductor chip 16 to each other may employ other adhesives or adhesive sheet materials or film materials, in place of using the anisotropic conductive adhesive. Further, the concrete structure of the stacked chips according to this embodiment may be varied in design, and the semiconductor chip in a sense of this invention is not concretely specified in kind.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first rectangular semiconductor chip having a first surface formed with a first electrode;
   a second rectangular semiconductor chip having a second surface formed with a second electrode to be connected to said first electrode and facing to said first surface such that the corners of said first surface and said second surface are deviated from each other, wherein said first semiconductor chip and said second semiconductor chip have a same area as viewed in plan;
   a third electrode provided at a corner on said first surface and connected to a lead terminal;
   a fourth electrode provided at a corner on said second surface and connected to said lead terminal;
   a bump formed on at least one of said first electrode and said second electrode; and
   an anisotropic conductive member interposed between said first surface and said second surface.

2. A semiconductor device according to claim 1, wherein said bump is provided on both of said first electrode and said second electrode, and said anisotropic conductive member being a film containing conductive particles.

3. A semiconductor device according to claim 1, further comprising an inner package covering a connecting portion between said first semiconductor chip and said second semiconductor chip, and an outer package covering said first semiconductor chip, said second semiconductor chip and said inner package.

4. A semiconductor device according to claim 3, wherein said inner package includes a first synthetic resin excellent in moisture resistance, and said outer package including a second synthetic resin excellent in adhesibility.

5. A semiconductor device according to claim 1, wherein said bump is provided on one of said first electrode and said second electrode, the other of said first electrode and said second electrode having a concave portion to be fitted with said bump.

6. A semiconductor device according to claim 1, further comprising a barrier metal formed on surfaces of said first electrode and said second electrode.

7. A semiconductor device according to claim 1, wherein a barrier metal is formed on a surface of said third electrode, and a metal layer is formed on a surface of said barrier metal.

8. A semiconductor device according to claim 7, wherein said metal layer is a thin film formed of gold.

9. A semiconductor device according to claim 7, further comprising a wire bonded to a surface of said metal layer.

10. A semiconductor device according to claim 1, further comprising a conductive protecting layer formed on surfaces of said first electrode and said second electrode.

11. A semiconductor device according to claim 10, wherein said conductive protecting layer includes a barrier metal layer and a metal layer.

12. A semiconductor device according to claim 11, said barrier metal layer includes a titanium layer and a platinum layer, and said metal layer is a bump formed of gold.

13. A semiconductor device according to claim 10, wherein said conductive protecting layer is at least one conductive polymer material selected from polythiazyl, polyacetylene, polydiacetylene, polypyrrole, polyparaphenylene, polyparaphenylene sulfide, polyparaphenylene vinylene and polythiophene.

14. A semiconductor device according to claim 10, wherein said first electrode and said second electrode include aluminum, and said anisotropic conductive member being a film based on an epoxy resin.

15. A semiconductor device according to claim 10, wherein said conductive protecting layer is formed on a surface of said third electrode.

16. A semiconductor device according to claim 1, further comprising a first protecting film covering at least one of said first surface and said second surface, and a second protecting film covering said first protecting film.

17. A semiconductor according to claim 16, wherein said first protecting film is a passivation film and said second protecting film is a synthetic resin film.

18. A semiconductor device according to claim 1, further comprising a soft-property film interposed, at an area except for said bump, between said first semiconductor chip and said second semiconductor chip.

19. A semiconductor device according to claim 18, said first electrode and said second electrode are respectively formed around said first semiconductor chip and said second semiconductor chip, and said soft-property film being placed at an inner side of said first electrode and said second electrode.

20. A semiconductor device according to claim 1, further comprising a package encapsulating said first semiconductor chip and said second semiconductor chip in a manner exposing at least one of a first back surface of said first semiconductor chip and a second back surface of said second semiconductor chip.

21. A semiconductor device according to claim 20, further comprising a third semiconductor chip having a third surface facing to one of said first back surface and said second back surface, said package encapsulating said first semiconductor chip, said second semiconductor chip and said third semiconductor chip in a manner exposing the other of said first back surface and said second back surface.

22. A semiconductor device according to claim 20, further comprising a heat sink provided in one of said first back surface and said second back surface, and the other of said first back surface and said second back surface as well as said heat sink being exposed outside of said package.

23. A semiconductor device according to claim 1, wherein said third electrode and said lead terminal are covered by said anisotropic conductive member.

24. A semiconductor device according to claim 1, further comprising a third electrode formed at a first predetermined position on said first surface and connected to a lead terminal, and a fourth electrode formed at a second predetermined position on said second surface and connected to said lead terminal, wherein said first surface at a portion except for said second predetermined position faces to said second surface at a portion except for said second predetermined position.

* * * * *